United States Patent
Huang et al.

(10) Patent No.: US 10,879,365 B2
(45) Date of Patent: Dec. 29, 2020

(54) TRANSISTORS WITH NON-VERTICAL GATES

(71) Applicant: Intel Corporation, Santa Clara, CA (US)

(72) Inventors: Cheng-Ying Huang, Hillsboro, OR (US); Sean T. Ma, Portland, OR (US); Willy Rachmady, Beaverton, OR (US); Gilbert Dewey, Hillsboro, OR (US); Matthew V. Metz, Portland, OR (US); Harold W. Kennel, Portland, OR (US); Jack T. Kavalieros, Portland, OR (US); Anand S. Murthy, Portland, OR (US); Tahir Ghani, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/490,866

(22) PCT Filed: Mar. 31, 2017

(86) PCT No.: PCT/US2017/025610
§ 371 (c)(1),
(2) Date: Sep. 3, 2019

(87) PCT Pub. No.: WO2018/182741
PCT Pub. Date: Oct. 4, 2018

(65) Prior Publication Data
US 2020/0006510 A1    Jan. 2, 2020

(51) Int. Cl.
*H01L 29/423* (2006.01)
*H01L 29/786* (2006.01)
(Continued)

(52) U.S. Cl.
CPC ...... *H01L 29/42384* (2013.01); *H01L 29/045* (2013.01); *H01L 29/66522* (2013.01);
(Continued)

(58) Field of Classification Search
CPC ............. H01L 29/42384; H01L 29/045; H01L 29/66522; H01L 29/66742;
(Continued)

(56) References Cited

U.S. PATENT DOCUMENTS

2009/0267078 A1   10/2009   Mishra et al.
2012/0181549 A1    7/2012   Johnson et al.
(Continued)

FOREIGN PATENT DOCUMENTS

JP    2000138235    5/2016

OTHER PUBLICATIONS

International Search Report and Written Opinion from PCT/US2017/025610 dated Dec. 27, 2017, 9 pgs.
(Continued)

*Primary Examiner* — Tong-Ho Kim
(74) *Attorney, Agent, or Firm* — Green, Howard & Mughal LLP

(57) ABSTRACT

In various embodiments, the disclosure describes transistors having non-vertical gates. In one embodiment, the non-vertical gates can have a curved or wide angle gate in order to reduce the electric field crowing on the drain side of the gate edge and/or portions having corners and thereby reduce leakage current in the transistor. In one embodiment, the non-vertical gate can be generated by one or more etching steps (for example, isotropic etching steps) of an underlying channel during the fabrication of a transistor having the non-vertical gate. In one embodiment, the non-vertical gate can be generated by one or more directional etching steps that may expose various facets having predetermined ori-
(Continued)

entations of a source and/or drain associated with the transistor.

20 Claims, 12 Drawing Sheets

(51) Int. Cl.
H01L 29/04 (2006.01)
H01L 29/66 (2006.01)

(52) U.S. Cl.
CPC .. H01L 29/66742 (2013.01); H01L 29/78618 (2013.01); H01L 29/78648 (2013.01); H01L 29/78681 (2013.01)

(58) Field of Classification Search
CPC ......... H01L 29/78618; H01L 29/78648; H01L 29/78681

USPC ....................................................... 257/288
See application file for complete search history.

(56) References Cited

U.S. PATENT DOCUMENTS

2014/0117379 A1 5/2014 Jung et al.
2015/0279607 A1 10/2015 Xiao
2015/0372145 A1* 12/2015 Cheng ............... H01L 29/42376
257/288

OTHER PUBLICATIONS

International Preliminary Report on Patentability from PCT/US2017/025610 dated Oct. 10, 2019, 8 pgs.

* cited by examiner

TRANSISTORS WITH NON-VERTICAL GATES

CLAIM OF PRIORITY

This Application is a National Stage Entry of, and claims priority to, PCT Application No. PCT/US2017/025610, filed on Mar. 31, 2017 and titled "TRANSISTORS WITH NON-VERTICAL GATES", which is incorporated by reference in its entirety for all purposes.

TECHNICAL FIELD

This disclosure generally relates to transistors, and more particularly to transistors.

BACKGROUND

Transistors can refer to semiconductor devices used to amplify or switch electronic signals and electrical power. Transistors can be composed of semiconductor material usually with at least three terminals for connection to an external circuit. The metal oxide semiconductor field-effect transistor (MOSFET) can refer to a type of transistor, for example, a type of field-effect transistor (FET). In one embodiment, a MOSFET can have an insulated gate, whose voltage can determine the conductivity of the device. This ability to change conductivity with the amount of applied voltage can be used for amplifying or switching electronic signals.

BRIEF DESCRIPTION OF THE FIGURES

Reference will now be made to the accompanying drawings, which are not necessarily drawn to scale, and wherein.

DETAILED DESCRIPTION

Figure 1:
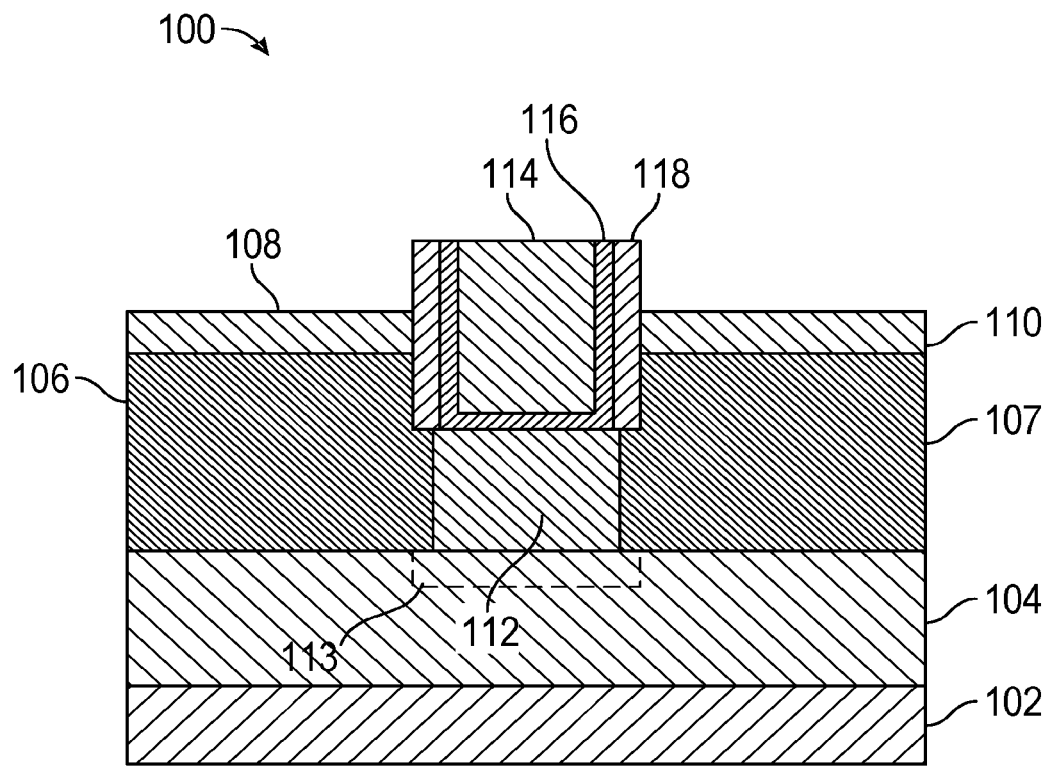
FIG. 1 shows a diagram of a transistor having a vertical gate.

Embodiments of the disclosure are described more fully hereinafter with reference to the accompanying drawings, in which example embodiments of the disclosure are shown. This disclosure may, however, be embodied in many different forms and should not be construed as limited to the example embodiments set forth herein; rather, these embodiments are provided so that this disclosure will be thorough and complete, and will fully convey the scope of the disclosure to those skilled in the art. Like numbers refer to like, but not necessarily the same or identical, elements throughout.

The following embodiments are described in sufficient detail to enable at least those skilled in the art to understand and use the disclosure. It is to be understood that other embodiments would be evident based on the present disclosure and that process, mechanical, material, dimensional, process equipment, and parametric changes may be made without departing from the scope of the present disclosure.

In the following description, numerous specific details are given to provide a thorough understanding of various embodiments of the disclosure. However, it will be apparent that the disclosure may be practiced without these specific details. In order to avoid obscuring the present disclosure, some well-known system configurations and process steps may not be disclosed in full detail. Likewise, the drawings showing embodiments of the disclosure are semi-diagrammatic and not to scale and, particularly, some of the dimensions are for the clarity of presentation and may be exaggerated in the drawings. In addition, where multiple embodiments are disclosed and described as having some features in common, for clarity and ease of illustration, description, and comprehension thereof, similar and like features will ordinarily be described with like reference numerals even if the features are not identical.

The term "horizontal" as used herein may be defined as a direction parallel to a plane or surface (for example, surface of a substrate), regardless of its orientation. The term "vertical," as used herein, may refer to a direction orthogonal to the horizontal direction as just described. Terms, such as "on," "above," "below," "bottom," "top," "side" (as in "sidewall"), "higher," "lower," "upper," "over," and "under," may be referenced with respect to a horizontal plane, where the horizontal plane can include an x-y plane, a x-z plane, or a y-z plane, as the case may be. The term "processing" as used herein includes deposition of material or photoresist, patterning, exposure, development, etching, cleaning, ablating, polishing, and/or removal of the material or photoresist as required in formation a described structure.

Transistors can refer to semiconductor devices used to amplify or switch electronic signals and electrical power. Transistors can be composed of semiconductor material usually with at least three terminals for connection to an external circuit. The metal oxide semiconductor field-effect transistor (MOSFET) can refer to a type of field-effect transistor (FET). In one embodiment, a MOSFET can have an insulated gate, whose voltage can determine the conductivity of the device. The ability to change conductivity with the amount of applied voltage can be used for amplifying or switching electronic signals.

Transistors (such as MOSFETs) may have a vertical gates, which can mean that the gate of the transistor can have portions having corners that are approximately 90°. Due to such sharp corners at the gate edge and/or corner (about 90°), the electric field can be relatively strong and concentrated at the gate edge and/or corner (as compared with other regions of the gate and/or transistor), potentially leading to large tunneling leakage current in the device. In one embodiment, in order to reduce the electric field at the gate edge and/or portions having corners of a transistor, (for example, a MOSFET device), a non-vertical gate comprising a curved or wide angle gate can be formed. Compared to transistors (for example, MOSFETs) having vertical gates, transistors having a non-vertical gate including a curved or wide angle gate can have a smoother spatial distribution of the electric field and a reduction of the electric field at the drain side of the gate edge.

Further, in Transistors (such as MOSFETs) having a vertical gate, electric field crowding on the drain side of the gate edge and/or corner can cause large band to band tunneling (BTBT) leakage and/or gate-induced drain leakage (GIDL) parasitics, reducing device performance. GIDL can be caused by high field effect in the drain junction of MOS transistors. For example, in an NMOS transistor, when the gate is biased at zero or negative voltage and the drain are biased at the supply voltage level, there can be an increase of effects like avalanche multiplication and band-to-band tunneling. Minority carriers underneath the gate can be swept to the substrate, completing the GIDL path.

In one embodiment, using the non-vertical gates having a curved or wide angle gate can reduce the electric field crowing on the drain side of the gate edge and/or corner and thereby reduce these above mentioned leakage currents. In one embodiment, the non-vertical gate can be generated by one or more etching steps (for example, isotropic etching steps) of an underlying channel during the fabrication of a transistor having the non-vertical gate. In one embodiment, the non-vertical gate can be generated by one or more directional etching steps that may expose various crystallographic facets having predetermined orientations of a source and/or drain associated with the transistor. For example, the orientation of a crystallographic facet of the source and/or drain can have Miller indices of (111). In one embodiment, the source or the drain of the transistor can include an n-doped InGaAs material. In another embodiment, the channel of the transistor comprises an InGaAs material.

In one embodiment, the disclosure can be used in connection with InGaAs or GaN high-electron-mobility transistor (HEMT) technology. In another embodiment, the disclosure can be used in connection with dynamic random-access memory (DRAM) structures. In one embodiment, the disclosure can be used in connection with logic transistors. In another embodiment, the disclosure can be used in connection with Ge/InGaAs alternative channels, for example, because high mobility channels may have smaller band gap energies.

FIG. 1 shows a diagram of a transistor 100 having a vertical gate, in accordance with one or more example embodiments of the disclosure. In one embodiment, the transistor 100 can include a substrate 102. In another embodiment, the substrate can include a silicon substrate. In one embodiment, the substrate 102 can refer to a solid (usually planar) substance onto which a layer of another substance is applied, and to which that second substance adheres. In another embodiment, the substrate 102 can include a silicon substrate. In one embodiment, the substrate 102 can include a p-doped silicon substrate. In one embodiment, the substrate 102 can be a thin slice of material such as silicon, silicon oxide, silicon dioxide, aluminum oxide, sapphire, an alloy of silicon and germanium, and/or indium phosphide (InP), and the like. In one embodiment, the substrate 102 can include a semiconductor material (e.g., monocrystalline silicon, germanium, silicon germanium, SiGe, and/or a III-V materials based material (e.g., gallium arsenide, GaAs), or any combination thereof).

In one embodiment, the transistor 100 can include a buffer layer 104. In one embodiment, the buffer layer 104 can include any material suitable to insulate adjacent devices and prevent current leakage. In one embodiment, the buffer layer 104 can include a shallow trench isolation (STI) layer. In one embodiment, the buffer layer 104 can include portion, such as portion, that may be proximate to a trench (not fully shown but represented by phantom lines 113), which can be formed in the buffer layer 104. In one embodiment, the STI layer can provide field isolation regions that isolate one channel and/or fin from other channels and/or fins (not shown), for example, other channels and/or fins on adjacent device(s). In one embodiment, the buffer layer 104 can include an oxide layer (e.g., silicon dioxide), or any other electrically insulating layer. In one embodiment, the buffer layer 104 can include an interlayer dielectric (ILD), such as silicon dioxide. In one embodiment, the buffer layer 104 may include polyimide, epoxy, photodefinable materials (for example, benzocyclobutene (BCB)), WPR-series materials, and/or spin-on-glass. In one embodiment, the buffer layer 104 can include a low permittivity (low-k) ILD layer. In one embodiment, low-k can refer to dielectrics having a dielectric constant (permittivity k) lower than the permittivity of silicon dioxide. In one embodiment, the thickness of the buffer layer 104 can be approximately 10 nm to approximately 200 nm, with an example thicknesses of approximately 50 nm to approximately 100 nm. In one embodiment, the buffer layer 104 can be deposited using physical vapor deposition (PVD), chemical vapor deposition (CVD), molecular beam epitaxy (MBE), metal organic chemical vapor deposition (MOCVD), and/or atomic layer deposition (ALD), and the like.

In an embodiment, the transistor 100 can include a source 106. In another embodiment, the source 106 can include an n doped Indian Gallium Arsenide layer. In one embodiment, the source 106 can include silicon. In another embodiment, the silicon material may be n-doped. In another embodiment, the source 106 can be fabricated using MBE. In another embodiment, the source 106 can include doped or undoped black phosphorous, titanium, tantalum, cobalt, molybdenum, titanium nitride, tantalum nitride, hafnium, copper, gadolinium, and the like. In one embodiment, the source 106 can include silicon, germanium, indium gallium arsenide (InGaAs), silicon germanium (SiGe), indium phosphide (InP), indium arsenide (InAs), gallium nitride (GaN), amorphous semiconductors such as zinc oxide (ZnO), indium gallium zinc oxide (IGZO), amorphous silicon (a-Si), amorphous germanium (a-Ge), polycrystalline germanium, polycrystalline silicon, and/or polycrystalline InGaAs, and the like. In one embodiment, the doping can include generating electron vacancies in the source 106. In one embodiment, source can include gettering materials. In one embodiment, the gettering materials can getter sulfur. In one embodiment, the source 106 can be doped, for example, by creating vacancies of sulfur and selenium. In one embodiment, the source 106 can be doped with oxygen vacancies if the source comprises an oxide or a multi-material system. In another embodiment, the source can be doped with phosphorous, boron, aluminum, tin, hafnium, titanium, copper, indium, and/or arsenic if the source 106 comprises a non-oxide a single-material semiconductor. In another embodiment, the source 106 can be approximately 1 nanometer to approximately 100 nm thick (y dimension), with example thicknesses of approximately 10 nm to approximately 50 nm thick (y dimension). In one embodiment, the source 106 can be deposited using PVD, CVD, MOCVD, MBE, and/or ALD, and the like.

In one embodiment, the transistor 100 can include a drain 107. In another embodiment, the drain can include an N doped Indian Gallium Arsenide material. In one embodiment, the drain 107 can be deposited using a mask. In one embodiment, the drain 107 can include silicon. In another embodiment, the silicon material may be n-doped. In another embodiment, the drain 107 can be fabricated using MBE. In another embodiment, the drain 107 can include can include doped or undoped black phosphorous, titanium, tantalum, cobalt, molybdenum, titanium nitride, tantalum nitride, hafnium, copper, gadolinium, and the like. In one embodiment, the doping can include generating electron vacancies in the drain 107. In one embodiment, the drain 107 can include silicon, germanium, indium gallium arsenide (InGaAs), silicon germanium (SiGe), indium phosphide (InP), indium arsenide (InAs), gallium nitride (GaN), amorphous semiconductors such as zinc oxide (ZnO), indium gallium zinc oxide (IGZO), amorphous silicon (a-Si), amorphous germanium (a-Ge), polycrystalline germanium, polycrystalline silicon, and/or polycrystalline InGaAs, and the like. In one embodiment, the drain can include gettering materials. In one embodiment, the gettering materials can getter sulfur. In one embodiment, the drain can be doped with oxygen vacancies if the source comprises an oxide or a multi-material system. In another embodiment, the source can be doped with phosphorous, boron, aluminum, tin, hafnium, titanium, copper, indium, and/or arsenic if the drain comprises a non-oxide a single-material semiconductor. In one embodiment, the drain 107 can have a thickness of approximately 1 nm to approximately 100 nm (in the x or y dimensions), with example thicknesses of approximately 10 nm to approximately 50 nm (in the x or y dimensions). In one embodiment, the drain 107 can be deposited using PVD, CVD, MOCVD, MBE, and/or ALD, and the like.

In one embodiment, the transistor 100 can include a source contact 108. In one embodiment, the source contact 108 can include a metal. In one embodiment, the metal can include gold, copper, silver, aluminum, zinc, tin, platinum, and any of the like. The source contact 108 can include any alloys of such materials. In one embodiment, the source contact 108 can have a thickness of approximately 2 nm to approximately 100 nm (in the x or y dimensions), with example thicknesses of approximately 5 nm to approximately 20 nm (in the x or y dimensions). In one embodiment, the source contact 108 can be deposited using PVD, CVD, MOCVD, MBE, and/or ALD, and the like.

In another embodiment, the transistor 100 can include a drain contract 110. In one embodiment, the drain contact 110 can include a metal. In one embodiment, the metal can include gold, copper, silver, aluminum, zinc, tin, platinum, and any of the like. The drain contact 110 can include any alloys of such materials. In one embodiment, the drain contract 110 can have a thickness of approximately 2 nm to approximately 100 nm (in the x or y dimensions), with example thicknesses of approximately 5 nm to approximately 20 nm (in the x or y dimensions). In one embodiment, the drain contract 110 can be deposited using PVD, CVD, MOCVD, MBE, and/or ALD, and the like.

In one embodiment, the transistor 100 can include a channel 112. In another embodiment, the channel 112 can include an Indian Gallium Arsenide material. In one embodiment, the device can further include a channel 112. In one embodiment, the channel 112 can include silicon. In another embodiment, the channel 112 can include intrinsic silicon. In one embodiment, the channel 112 can be deposited using MBE. In another embodiment, the channel 112 can include black phosphorous, amorphous silicon, germanium, carbon nanotube, and the like. In one embodiment, the channel 112 can include silicon, germanium, silicon germanium (SiGe), indium phosphide (InP), indium arsenide (InAs), indium gallium arsenide (InGaAs), gallium nitride (GaN), amorphous semiconductors such as zinc oxide (ZnO), indium gallium zinc oxide (IGZO), amorphous silicon (a-Si), amorphous germanium (a-Ge), polycrystalline germanium, polycrystalline silicon, and/or polycrystalline InGaAs, and the like. In one embodiment, the channel width can depend on the technology used to generate the transistor. In another embodiment, the channel 112 can be approximately 0.5 nm to approximately 200 nm long (in the y-dimension), with example thicknesses of approximately 60 nm to approximately 80 nm long (in the y-dimension). In one embodiment, the channel width can be approximately 200 nm down to approximately 5 nm (in the x-dimension). In one embodiment, the channel 112 can be deposited using PVD, CVD, MOCVD, MBE, and/or ALD, and the like.

In one embodiment, the transistor 100 can include a gate 114, for example, a vertical gate 114, which can mean that the gate of the transistor can have portions having corners that are approximately 90°. Due to the sharp corner at the gate edge and/or corner (about 90°), the electric field can be strong and concentrated at the gate edge and/or corner, potentially leading to large tunneling leakage current in the device. In another embodiment, the gate 114 can include a metal. In another embodiment, the gate 114 can include a transition metal. In one embodiment, the gate 114 can be used to tune the threshold voltage of the device. In one embodiment, gate 114 can include titanium nitride, cobalt, tungsten and/or platinum. In one embodiment, the gate 114 can be deposited using PVD, CVD, MOCVD, MBE and/or ALD, and the like. In one embodiment, the gate 114 can have a width of approximately 5 nm to approximately 150 nm (x-dimension). In another embodiment, the gate 114 can have a length of approximately 10 nm to approximately 150 nm (y-dimension).

In another embodiment, the transistor 100 can include a gate material 116. In one embodiment, the gate material 116 can include a high-K dielectric material. In another embodiment, the high-K material, for example, hafnium oxide, tantalum oxide, titanium oxide, aluminum oxide, silicon dioxide, silicon nitride and the like. In another embodiment, the gate material 116 can include silicon oxide, which may not be a high-K material. In one embodiment, an electroglass (EG) can be used as the gate material 116. In one embodiment, the gate material 116 can include hydrogenated boron nitride (HBN). In one embodiment, the gate material 116 can be deposited using PVD, CVD, MOCVD, MBE, and/or ALD, and the like. In one embodiment, the gate material 116 can have a width of 0.5 nm to approximately 20 nm (x-dimension). In another embodiment, the gate material 116 can have a thickness of approximately 0.5 nm to approximately 100 nm (in the y dimension).

In one embodiment, the transistor 100 can include a spacer 118. In another embodiment, spacer 118 can include an oxide. In one embodiment, the oxide can include an interlayer dielectric (ILD) material. In another embodiment, ILD can include silicon dioxide (SiO2), or a low-K material. In one embodiment, the spacer 118 can be deposited using PVD, CVD, MOCVD, and/or ALD, and the like. In one embodiment, the spacer 118 can have a width of 0.5 nm to approximately 20 nm (x-dimension). In another embodiment, the spacer 118 can have a thickness of approximately 0.5 nm to approximately 100 nm (in the y dimension).

Figure 2A:
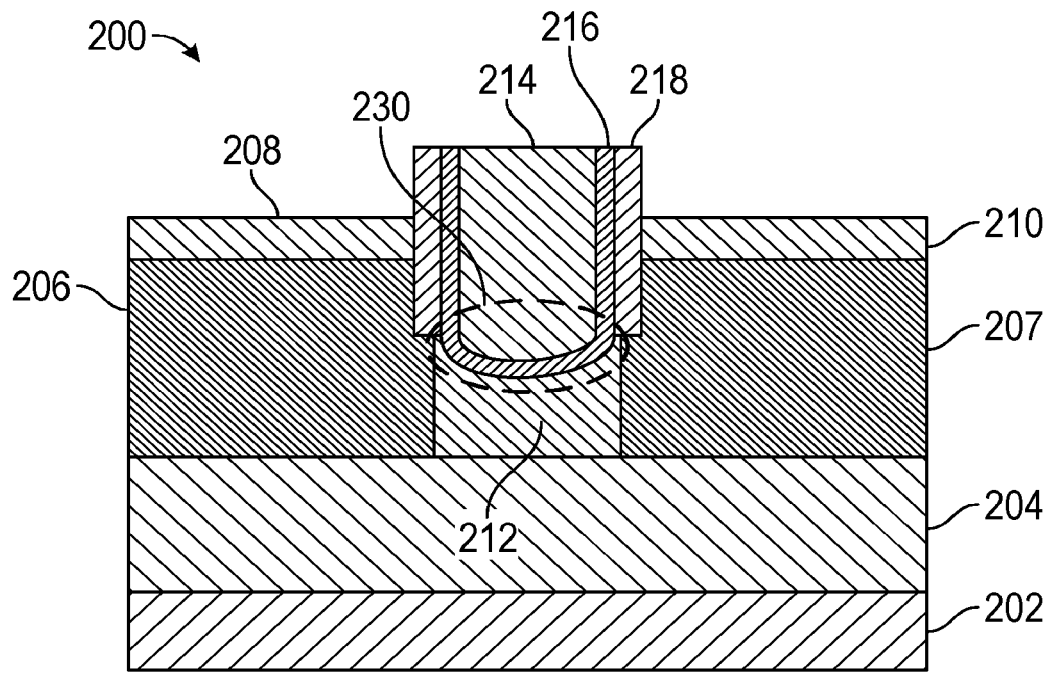
FIG. 2A shows a first diagram of the transistor having a non-vertical gate, in accordance with one or more example embodiments of the disclosure.

FIG. 2A shows a diagram of the transistor 200 having a non-vertical gate, in accordance with one or more example embodiments of the disclosure. In one embodiment, the transistor 200 can include a wide-angle region 230. In one embodiment, the wide-angle region 230 can be generated by an etching step applied on the channel 212. In one embodiment, the etching process can include, for example, a dry etch. In one embodiment, the dry etch can include, for example, a plasma-based and/or a mechanical-based etch. In one embodiment, the etching process can include, for example, a wet etch. The wet etching process can include, for example, any suitable chemicals for the removal of the portion of the channel 212. In a later step, the gate 214 and the gate material 216 can be deposited on the channel 212 including the wide-angle region 230, thereby providing a non-vertical gate 214.

In one embodiment, the transistor 200 can include a substrate 202. In another embodiment, the substrate can include a silicon substrate. In one embodiment, the substrate 202 can refer to a solid (usually planar) substance onto which a layer of another substance is applied, and to which that second substance adheres. In another embodiment, the substrate 202 can include a silicon substrate. In one embodiment, the substrate 202 can include a p-doped silicon substrate. In one embodiment, the substrate 202 can be a thin slice of material such as silicon, silicon oxide, silicon dioxide, aluminum oxide, sapphire, an alloy of silicon and germanium, and/or indium phosphide (InP), and the like. In one embodiment, the substrate 202 can include a semiconductor material (e.g., monocrystalline silicon, germanium, silicon germanium, SiGe, and/or a III-V materials based material (e.g., gallium arsenide, GaAs), or any combination thereof).

In one embodiment, the transistor 200 can include a buffer layer 204, for example, proximate to the substrate 202. In one embodiment, the buffer layer 204 can include any material suitable to insulate adjacent devices and prevent current leakage. In one embodiment, the buffer layer 204 can include a shallow trench isolation (STI) layer. In one embodiment, the STI layer can provide field isolation regions that isolate one fin from other fins (not shown), for example, other fins on adjacent device. In one embodiment, the buffer layer 204 can include an oxide layer (e.g., silicon dioxide), or any other electrically insulating layer. In one embodiment, the buffer layer 204 can include an interlayer dielectric (ILD), such as silicon dioxide. In one embodiment, the buffer layer 204 may include polyimide, epoxy, photodefinable materials (for example, benzocyclobutene, BCB), WPR-series materials, and/or spin-on-glass. In one embodiment, the buffer layer 204 can include a low permittivity (low-k) ILD layer. In one embodiment, low-k can refer to dielectrics having a dielectric constant (permittivity k) lower than the permittivity of silicon dioxide. In one embodiment, the thickness of the buffer layer 204 can be approximately 10 nm to approximately 200 nm, with an example thicknesses of approximately 50 nm to approximately 100 nm. In one embodiment, the buffer layer 204 can be deposited using PVD, CVD and/or ALD, and the like.

In an embodiment, the transistor 200 can include a source 206, for example, proximate to the buffer layer 204. In another embodiment, the source 206 can include an n doped Indian Gallium Arsenide layer. In one embodiment, the source 206 can include silicon. In another embodiment, the silicon material may be n-doped. In another embodiment, the source 206 can be fabricated using MBE. In another embodiment, the source 206 can include doped or undoped black phosphorous, titanium, tantalum, cobalt, molybdenum, titanium nitride, tantalum nitride, hafnium, copper, gadolinium, and the like. In one embodiment, the source 206 can include silicon, germanium, silicon germanium (SiGe), indium phosphide (InP), indium arsenide (InAs), indium gallium arsenide (InGaAs), gallium nitride (GaN), amorphous semiconductors such as zinc oxide (ZnO), indium gallium zinc oxide (IGZO), amorphous silicon (a-Si), amorphous germanium (a-Ge), polycrystalline germanium, polycrystalline silicon, and/or polycrystalline InGaAs, and the like. In one embodiment, the doping can include generating electron vacancies in the source 206. In one embodiment, source can include gettering materials. In one embodiment, the gettering materials can getter sulfur. In one embodiment, the source 206 can be doped, for example, by creating vacancies of sulfur and selenium. In one embodiment, the source 206 can be doped with oxygen vacancies if the source comprises an oxide or a multi-material system. In another embodiment, the source can be doped with phosphorous, boron, aluminum, tin, hafnium, titanium, copper, indium, and/or arsenic if the source 206 comprises a non-oxide a single-material semiconductor. In another embodiment, the source 206 can be approximately 1 nanometer to approximately 100 nm thick, with example thicknesses of approximately 10 nm to approximately 50 nm thick. In one embodiment, the source 206 can be deposited using PVD, CVD, MOCVD, MBE, and/or ALD, and the like.

In one embodiment, the transistor 200 can include a drain 207, for example, proximate to the buffer layer 204. In another embodiment, the drain can include an N doped Indian Gallium Arsenide material. In one embodiment, the drain 207 can include silicon. In another embodiment, the silicon material may be n-doped. In another embodiment, the drain 207 can be fabricated using MBE. In another embodiment, the drain 207 can include can include doped or undoped black phosphorous, titanium, tantalum, cobalt, molybdenum, titanium nitride, tantalum nitride, hafnium, copper, gadolinium, and the like. In one embodiment, the doping can include generating electron vacancies in the drain 207. In one embodiment, the drain 207 can include silicon, germanium, indium gallium arsenide (InGaAs), silicon germanium (SiGe), indium phosphide (InP), indium arsenide (InAs), gallium nitride (GaN), amorphous semiconductors such as zinc oxide (ZnO), indium gallium zinc oxide (IGZO), amorphous silicon (a-Si), amorphous germanium (a-Ge), polycrystalline germanium, polycrystalline silicon, and/or polycrystalline InGaAs, and the like. In one embodiment, the drain can include gettering materials. In one embodiment, the gettering materials can getter sulfur. In one embodiment, the drain can be doped with oxygen vacancies if the source comprises an oxide or a multi-material system. In another embodiment, the source can be doped with phosphorous, boron, aluminum, tin, hafnium, titanium, copper, indium, and/or arsenic if the drain comprises a non-oxide a single-material semiconductor. In one embodiment, the drain 207 can have a thickness of approximately 0.5 nm to approximately 100 nm (in the x or y dimensions), with example thicknesses of approximately 0.5 nm to approximately 20 nm (in the x or y dimensions). In one embodiment, the drain 207 can be deposited using PVD, CVD, MOCVD, MBE, and/or ALD, and the like.

In one embodiment, the transistor 200 can include a source contact 208, for example, proximate to the source 206. In one embodiment, the source contact 208 can include a metal. In one embodiment, the metal can include gold, copper, silver, aluminum, zinc, tin, platinum, and any of the like. The source contact 208 can include any alloys of such materials.

In another embodiment, the transistor 200 can include a drain contract 210, for example, proximate to the drain 207. In one embodiment, the drain contact 210 can include a metal. In one embodiment, the metal can include gold, copper, silver, aluminum, zinc, tin, platinum, and any of the like. The drain contact 210 can include any alloys of such materials.

In one embodiment, the transistor 200 can include a channel 212, for example, proximate to the buffer layer 204, source 206, and/or drain 207. In another embodiment, the channel 212 can include an Indian Gallium Arsenide material. In one embodiment, the device can further include a channel 212. In one embodiment, the channel 206 can include silicon. In another embodiment, the channel 212 can include intrinsic silicon. In one embodiment, the channel 212 can be deposited using MBE. In another embodiment, the channel 212 can include black phosphorous, amorphous silicon, germanium, carbon nanotube, and the like. In one embodiment, the channel 212 can include silicon, germanium, indium gallium arsenide (InGaAs), silicon germanium (SiGe), indium phosphide (InP), indium arsenide (InAs), gallium nitride (GaN), amorphous semiconductors such as zinc oxide (ZnO), indium gallium zinc oxide (IGZO), amorphous silicon (a-Si), amorphous germanium (a-Ge), polycrystalline germanium, polycrystalline silicon, and/or polycrystalline InGaAs, and the like. In one embodiment, the channel width can depend on the technology used to generate the transistor. In another embodiment, the channel 212 can be approximately 0.5 nm to approximately 200 nm long (in the y-dimension), with example thicknesses of approximately 60 nm to approximately 80 nm long (in the y-dimension). In one embodiment, the channel width can be approximately 200 nm down to approximately 5 nm (in the x-dimension). In one embodiment, the channel 212 can be deposited using PVD, CVD, MOCVD, MBE, and/or ALD, and the like.

In one embodiment, the transistor 200 can include a gate 214, for example, proximate to the source 206 and/or drain 207. In another embodiment, the gate 214 can include a metal. In another embodiment, the gate 214 can include a transition metal. In one embodiment, the gate 214 can be used to tune the threshold voltage of the device. In one embodiment, gate 214 can include titanium nitride, cobalt, tungsten and/or platinum. In one embodiment, the gate 214 can be deposited using PVD, CVD, MOCVD, MBE and/or ALD, and the like. In one embodiment, the gate 214 can have a width of approximately 10 nm to approximately 150 nm (x-dimension). In another embodiment, the gate 214 can have a length of approximately 10 nm to approximately 150 nm (y-dimension).

In another embodiment, the transistor 200 can include a gate material 216, for example, proximate to the source 206 and/or drain 207. In one embodiment, the gate material 216 can include a high-K dielectric material. In another embodiment, the high-K material, for example, hafnium oxide, tantalum oxide, titanium oxide, aluminum oxide, silicon dioxide, silicon nitride and the like. In another embodiment, the gate material 216 can include silicon oxide, which may not be a high-K material. In one embodiment, an electro-glass (EG) can be used as the gate material 216. In one embodiment, the gate material 216 can include hydrogenated boron nitride (HBN). In one embodiment, the gate material can be deposited using PVD, CVD, MOCVD, MBE, and/or ALD, and the like. In one embodiment, the gate material 216 can have a width of 0.5 nm to approximately 20 nm (x-dimension). In another embodiment, the gate material 216 can have a thickness of approximately 0.5 nm to approximately 100 nm (in the y dimension).

In one embodiment, the transistor 200 can include a spacer 218. In another embodiment, spacer 218 can include an oxide. In one embodiment, the oxide can include an interlayer dielectric (ILD) material. In another embodiment, ILD can include silicon dioxide (SiO2), or a low-K material. In one embodiment, the oxide can be deposited using PVD, CVD, MOCVD, and/or ALD, and the like.

Figure 2B:
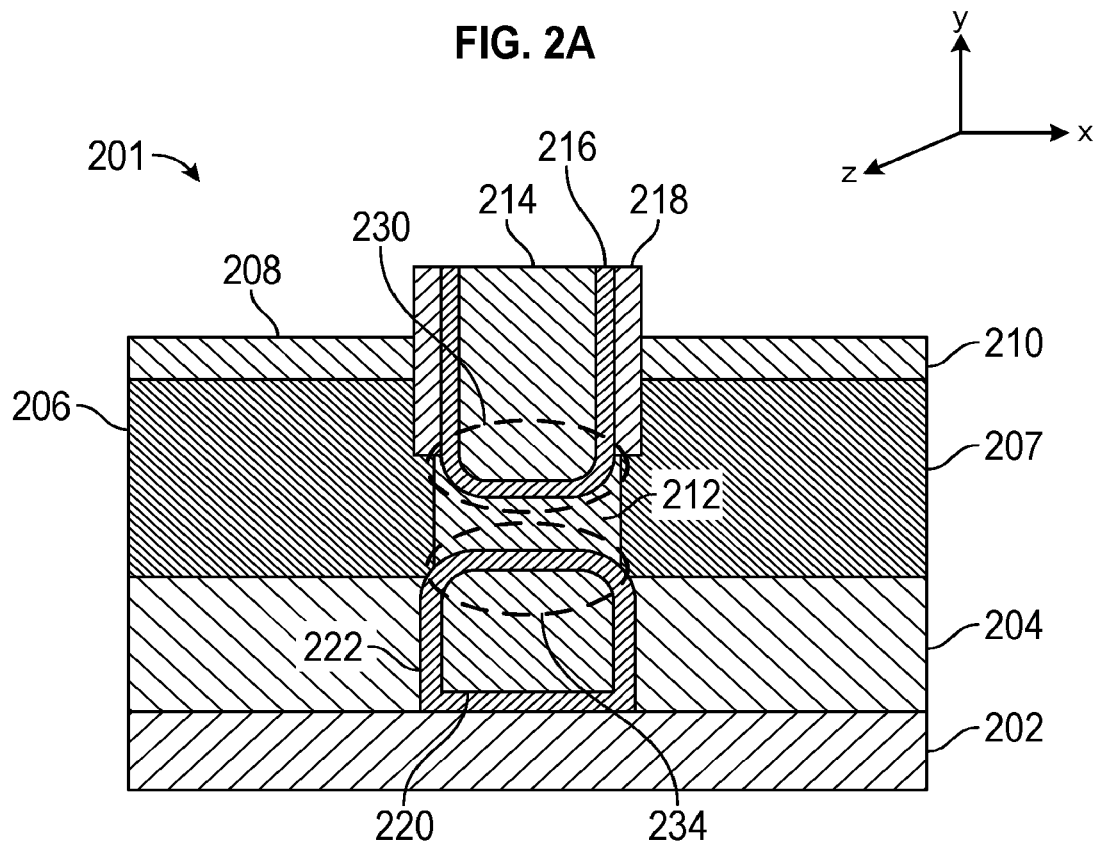
FIG. 2B shows a second diagram of a transistor having a non-vertical gate, in accordance with one or more example embodiments of the disclosure.

FIG. 2B shows a diagram of a transistor 201 having a non-vertical gate, in accordance with one or more example embodiments of the disclosure.

In another embodiment, the transistor 201 can include a second wide-angle area 234 for a second gate associated with the transistor 201. In one embodiment, the second wide-angle region 234 can be generated by an etching step applied on the channel 212. In one embodiment, the etching process can include, for example, a dry etch. In one embodiment, the dry etch can include, for example, a plasma-based and/or a mechanical-based etch. In one embodiment, the etching process can include, for example, a wet etch. The wet etching process can include, for example, any suitable chemicals for the removal of the portion of the channel 212. In a later step, a second gate 214 and a second gate material 222 can be deposited on the channel 212 including the wide-angle region 234, thereby providing a non-vertical gate 220.

In one embodiment, the transistor 201 can include a second gate 220, for example, proximate to the buffer layer 204. In another embodiment, the gate 220 can include a metal. In another embodiment, the gate 220 can include a transition metal. In one embodiment, the gate 220 can be used to tune the threshold voltage of the device. In one embodiment, gate 220 can include titanium nitride, cobalt, tungsten and/or platinum. In one embodiment, the gate 220 can be deposited using PVD, CVD, MOCVD, MBE and/or ALD, and the like. In one embodiment, the gate 220 can have a width of approximately 10 nm to approximately 150 nm (x-dimension). In another embodiment, the gate 220 can have a length of approximately 10 nm to approximately 150 nm (y-dimension).

In one embodiment, the transistor 201 can include a second gate material 222, for example, proximate to the buffer layer 204. In one embodiment, the gate material 222 can include a high-K dielectric material. In another embodiment, the high-K material, for example, hafnium oxide, tantalum oxide, titanium oxide, aluminum oxide, silicon dioxide, silicon nitride and the like. In another embodiment, the gate material 222 can include silicon oxide, which may not be a high-K material. In one embodiment, an electroglass (EG) can be used as the gate material 222. In one embodiment, the gate material 222 can include hydrogenated boron nitride (HBN). In one embodiment, the gate material can be deposited using PVD, CVD, MOCVD, MBE, and/or ALD, and the like. In one embodiment, the gate material 222 can have a width of 0.5 nm to approximately 20 nm (x-dimension). In another embodiment, the gate material 222 can have a thickness of approximately 0.5 nm to approximately 100 nm (in the y dimension).

In one embodiment, the transistor 200 can include a wide-angle area 230. In one embodiment, the wide-angle region 230 can be generated by an etching step applied on the channel 212. In one embodiment, the etching process can include, for example, a dry etch. In one embodiment, the dry etch can include, for example, a plasma-based and/or a mechanical-based etch. In one embodiment, the etching process can include, for example, a wet etch. The wet etching process can include, for example, any suitable chemicals for the removal of the portion of the channel 212. In a later step, the gate 214 and the gate material 216 can be deposited on the channel 212 including the wide-angle region 230, thereby providing a non-vertical gate 214.

In one embodiment, the transistor 200 can include a substrate 202. In another embodiment, the substrate can include a silicon substrate. In one embodiment, the substrate 202 can refer to a solid (usually planar) substance onto which a layer of another substance is applied, and to which that second substance adheres. In another embodiment, the substrate 202 can include a silicon substrate. In one embodiment, the substrate 202 can include a p-doped silicon substrate. In one embodiment, the substrate 202 can be a thin slice of material such as silicon, silicon oxide, silicon dioxide, aluminum oxide, sapphire, an alloy of silicon and germanium, and/or indium phosphide (InP), and the like. In one embodiment, the substrate 202 can include a semiconductor material (e.g., monocrystalline silicon, germanium, silicon germanium, SiGe, and/or a III-V materials based material (e.g., gallium arsenide, GaAs), or any combination thereof).

In one embodiment, the transistor 200 can include a buffer layer 204 for example, proximate to the substrate 202. In one embodiment, the buffer layer 204 can include any material suitable to insulate adjacent devices and prevent current leakage. In one embodiment, the buffer layer 204 can include a shallow trench isolation (STI) layer. In one embodiment, the STI layer can provide field isolation regions that isolate one fin from other fins (not shown), for example, other fins on adjacent device. In one embodiment, the buffer layer 204 can include an oxide layer (e.g., silicon dioxide), or any other electrically insulating layer. In one embodiment, the buffer layer 204 can include an interlayer dielectric (ILD), such as silicon dioxide. In one embodiment, the buffer layer 204 may include polyimide, epoxy, photodefinable materials (for example, benzocyclobutene (BCB)), WPR-series materials, and/or spin-on-glass. In one embodiment, the buffer layer 204 can include a low permittivity (low-k) ILD layer. In one embodiment, low-k can refer to dielectrics having a dielectric constant (permittivity k) lower than the permittivity of silicon dioxide. In one embodiment, the thickness of the buffer layer 204 can be approximately 10 nm to approximately 200 nm, with an example thicknesses of approximately 50 nm to approximately 100 nm. In one embodiment, the buffer layer 204 can be deposited using PVD, CVD and/or ALD, and the like.

In an embodiment, the transistor 200 can include a source 206, for example, proximate to the buffer layer 204. In another embodiment, the source 206 can include an n doped Indian Gallium Arsenide layer. In one embodiment, the source 206 can include silicon. In another embodiment, the silicon material may be n-doped. In another embodiment, the source 206 can be fabricated using MBE. In another embodiment, the source 206 can include doped or undoped black phosphorous, titanium, tantalum, cobalt, molybdenum, titanium nitride, tantalum nitride, hafnium, copper, gadolinium, and the like. In one embodiment, the source 206 can include silicon, germanium, silicon germanium (SiGe), indium phosphide (InP), indium arsenide (InAs), indium gallium arsenide (InGaAs), gallium nitride (GaN), amorphous semiconductors such as zinc oxide (ZnO), indium gallium zinc oxide (IGZO), amorphous silicon (a-Si), amorphous germanium (a-Ge), polycrystalline germanium, polycrystalline silicon, and/or polycrystalline InGaAs, and the like. In one embodiment, the doping can include generating electron vacancies in the source 206. In one embodiment, source can include gettering materials. In one embodiment, the gettering materials can getter sulfur. In one embodiment, the source 206 can be doped, for example, by creating vacancies of sulfur and selenium. In one embodiment, the source 206 can be doped with oxygen vacancies if the source comprises an oxide or a multi-material system. In another embodiment, the source can be doped with phosphorous, boron, aluminum, tin, hafnium, titanium, copper, indium, and/or arsenic if the source 206 comprises a nonoxide a single-material semiconductor. In another embodiment, the source 206 can be approximately 1 nanometer to approximately 75 nm thick (y dimension), with example thicknesses of approximately 20 nm to approximately 30 nm thick (y dimension). In one embodiment, the source 206 can be deposited using PVD, CVD, MOCVD, MBE, and/or ALD, and the like.

In one embodiment, the transistor 200 can include a drain 207, for example, proximate to the buffer layer 204. In another embodiment, the drain can include an N doped Indian Gallium Arsenide material. In one embodiment, the drain 207 can include silicon. In another embodiment, the silicon material may be n-doped. In another embodiment, the drain 207 can be fabricated using MBE. In another embodiment, the drain 207 can include can include doped or undoped black phosphorous, titanium, tantalum, cobalt, molybdenum, titanium nitride, tantalum nitride, hafnium, copper, gadolinium, and the like. In one embodiment, the doping can include generating electron vacancies in the drain 207. In one embodiment, the drain 207 can include silicon, germanium, silicon germanium (SiGe), indium phosphide (InP), indium arsenide (InAs), indium gallium arsenide (InGaAs), gallium nitride (GaN), amorphous semiconductors such as zinc oxide (ZnO), indium gallium zinc oxide (IGZO), amorphous silicon (a-Si), amorphous germanium (a-Ge), polycrystalline germanium, polycrystalline silicon, and/or polycrystalline InGaAs, and the like. In one embodiment, the drain can include gettering materials. In one embodiment, the gettering materials can getter sulfur. In one embodiment, the drain can be doped with oxygen vacancies if the source comprises an oxide or a multi-material system. In another embodiment, the source can be doped with phosphorous, boron, aluminum, tin, hafnium, titanium, copper, indium, and/or arsenic if the drain comprises a non-oxide a single-material semiconductor. In one embodiment, the drain 207 can have a thickness of approximately 0.5 nm to approximately 100 nm (in the x or y dimensions), with example thicknesses of approximately 0.5 nm to approximately 20 nm (in the x or y dimensions). In one embodiment, the drain 207 can be deposited using PVD, CVD, MOCVD, MBE, and/or ALD, and the like. In one embodiment, the source 206 and drain 207 can include the same material, except that the source 207 can be treated to remove some of the sulfur and/or selenium.

In one embodiment, the transistor 200 can include a source contact 208 for example, proximate to the source 206. In one embodiment, the source contact 208 can include a metal. In one embodiment, the metal can include gold, copper, silver, aluminum, zinc, tin, platinum, and any of the like. The source contact 108 can include any alloys of such materials.

In another embodiment, the transistor 200 can include a drain contract 210 for example, proximate to the drain 207. In one embodiment, the drain contact 210 can include a metal. In one embodiment, the metal can include gold, copper, silver, aluminum, zinc, tin, platinum, and any of the like. The drain contact 210 can include any alloys of such materials.

In one embodiment, the transistor 200 can include a channel 212, for example, proximate to the source 206 and/or drain 207. In another embodiment, the channel 212 can include an Indian Gallium Arsenide material. In one embodiment, the device can further include a channel 212. In one embodiment, the channel 206 can include silicon. In another embodiment, the channel 212 can include intrinsic silicon. In one embodiment, the channel 212 can be deposited using MBE. In another embodiment, the channel 212 can include black phosphorous, amorphous silicon, germanium, carbon nanotube, and the like. In one embodiment, the channel 212 can include silicon, germanium, silicon germanium (SiGe), indium phosphide (InP), indium arsenide (InAs), indium gallium arsenide (InGaAs), gallium nitride (GaN), amorphous semiconductors such as zinc oxide (ZnO), indium gallium zinc oxide (IGZO), amorphous silicon (a-Si), amorphous germanium (a-Ge), polycrystalline germanium, polycrystalline silicon, and/or polycrystalline InGaAs, and the like. In one embodiment, the channel width can depend on the technology used to generate the transistor. In another embodiment, the channel 212 can be approximately 0.5 nm to approximately 200 nm long (in the y-dimension), with example thicknesses of approximately 60 nm to approximately 80 nm long (in the y-dimension). In one embodiment, the channel width can be approximately 200 nm down to approximately 5 nm (in the x-dimension). In one embodiment, the channel 212 can be deposited using PVD, CVD, MOCVD, MBE, and/or ALD, and the like.

In one embodiment, the transistor 200 can include a gate 214, for example, proximate to the source 206 and/or drain 207. In another embodiment, the gate 214 can include a metal. In one embodiment, the gate 214 can include a transition metal. In one embodiment, the gate 214 can be used to tune the threshold voltage of the device. In one embodiment, gate 214 can include titanium nitride, cobalt, tungsten and/or platinum. In one embodiment, the gate 214 can be deposited using PVD, CVD, MOCVD, MBE and/or ALD, and the like. In one embodiment, the gate 214 can have a width of approximately 10 nm to approximately 150 nm (x-dimension). In another embodiment, the gate 214 can have a length of approximately 10 nm to approximately 150 nm (y-dimension).

In another embodiment, the transistor 200 can include a gate material 216, for example, proximate to the source 206 and/or drain 207. In one embodiment, the gate material 216 can include a high-K dielectric material. In another embodiment, the high-K material, for example, hafnium oxide, tantalum oxide, titanium oxide, aluminum oxide, silicon dioxide, silicon nitride and the like. In another embodiment, the gate material 216 can include silicon oxide, which may not be a high-K material. In one embodiment, an electroglass (EG) can be used as the gate material 216. In one embodiment, the gate material 216 can include hydrogenated boron nitride (HBN). In one embodiment, the gate material can be deposited using PVD, CVD, MOCVD, MBE, and/or ALD, and the like. In one embodiment, the gate material 216 can have a width of 0.5 nm to approximately 20 nm (x-dimension). In another embodiment, the gate material 216 can have a thickness of approximately 0.5 nm to approximately 100 nm (in the y dimension).

In one embodiment, the transistor 200 can include a spacer 218, for example, proximate to the source 206 and/or drain 207. In another embodiment, spacer 218 can include an oxide. In one embodiment, the oxide can include an interlayer dielectric (ILD) material. In another embodiment, ILD can include silicon dioxide ($SiO_2$), or a low-K material. In one embodiment, the oxide can be deposited using PVD, CVD, MOCVD, and/or ALD, and the like.

Figure 2C:
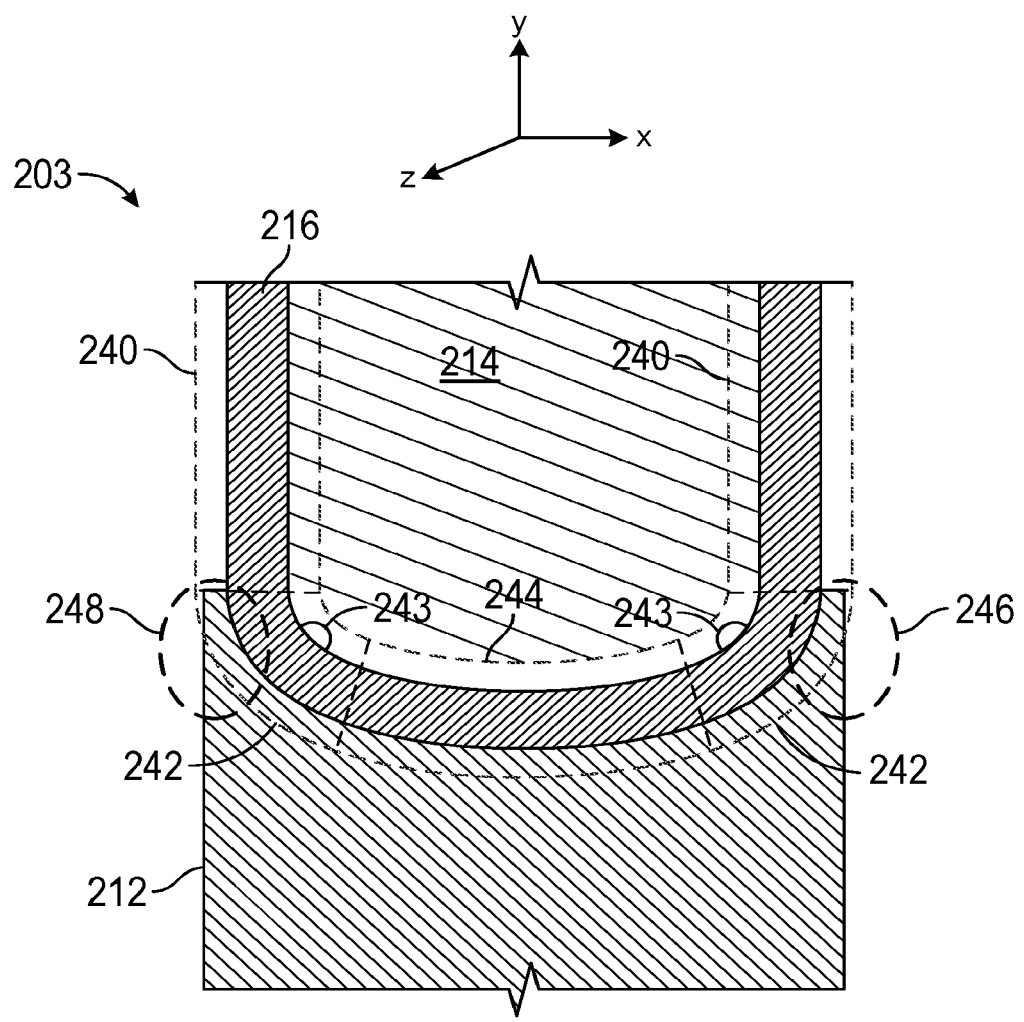
FIG. 2C shows a diagram of an enlarged portion of the transistor having a non-vertical gate of FIG. 2B, in accordance with example embodiments of the disclosure.

FIG. 2C shows a diagram 203 of an enlarged portion of the transistor having a non-vertical gate of FIG. 2B, in accordance with example embodiments of the disclosure. In one embodiment, FIG. 2C shows a first portion 240 of the gate 214 and/or gate dielectric 216, a connecting portion 242 of the gate 214 and/or gate dielectric 216, and a second portion 244 of the gate 214 and/or gate dielectric 216. In one embodiment, the first portion 240 of the gate 214 and/or gate dielectric 216 can have at least a portion including one or more planar side walls. Similarly, in another embodiment, the second portion 244 of the gate 214 and/or gate dielectric 216 can have at least a portion including one or more planar bottom walls. In one embodiment, the connecting portion 242 can have at least an arcuate and/or curved portion. In one embodiment, the connecting portion 242 can have more than one angle, for example, more than one obtuse angle, such as angle 243. In one embodiment, the more than angle can have an angle of greater than about ninety degrees. In one embodiment, the connecting portion 242 can be generated by an etching process, as described further herein. In one embodiment, the connecting portion 242 can have a radius of curvature that is finite. In one embodiment, the connecting portion 242 can have cross-section having a well-defined derivative at all points along the cross-section of the connecting portion 242. For example, if the connecting portion 242 were to have a sharp corner (with an interior angle of less than or equal to ninety degrees), the derivative may be undefined at least one point along the cross-section of the connecting portion 242. In one embodiment, the channel 212 can have a first portion 246 and/or a second portion 248, where the first portion 246 and/or second portion 248 can mechanically connect to and/or mate with a corresponding section, for example, a first portion of the connecting portions 242.

Figures 3A, 3B:
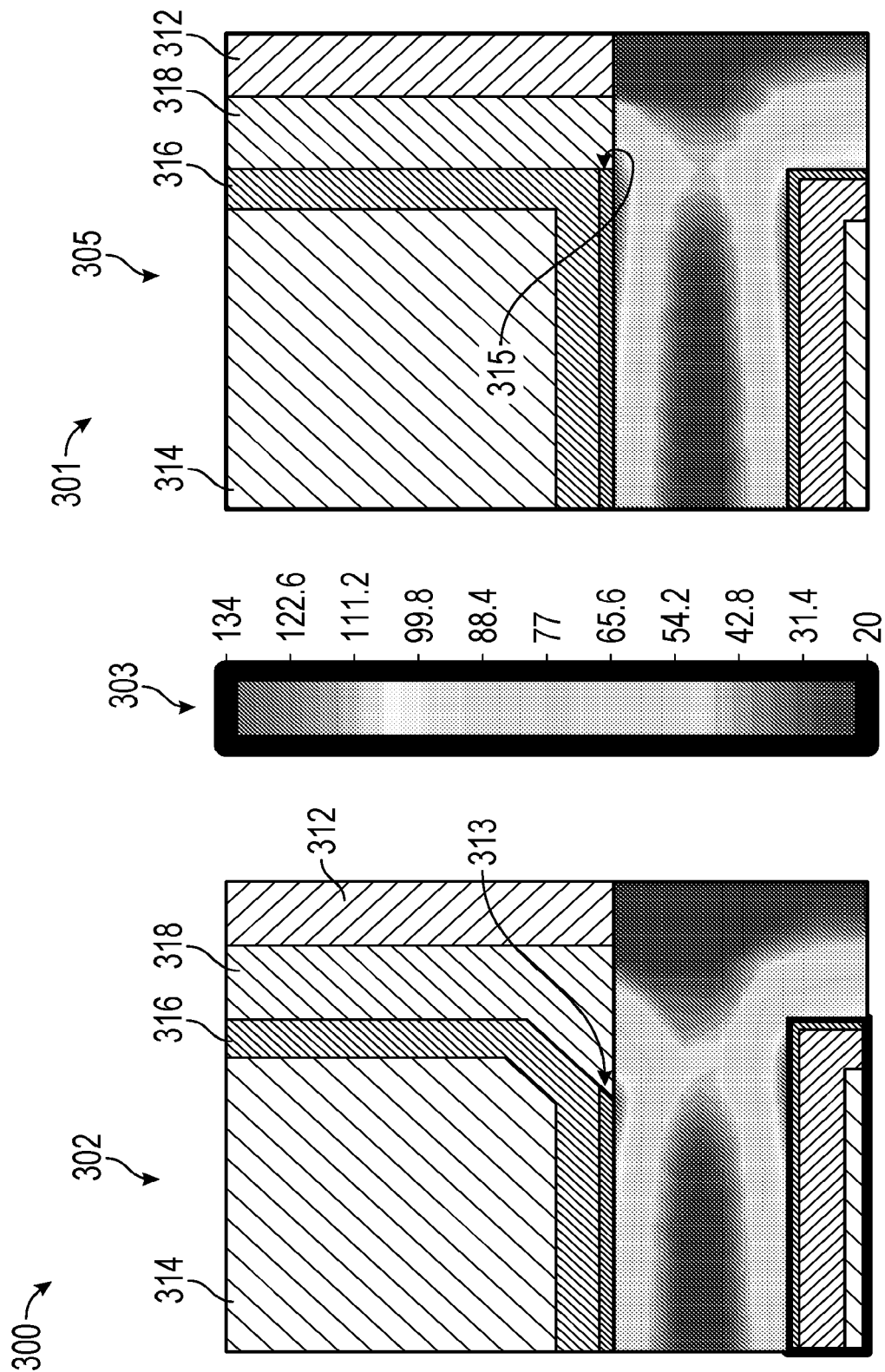
FIG. 3A shows a plot of the electric field for a transistor comprising a non-vertical gate, in accordance with one or more example embodiments of the disclosure.
FIG. 3B shows a plot of an electrical field for a transistor comprising a vertical gate.

FIG. 3A shows a contour plot 300 of an electric field for a transistor comprising a non-vertical gate 302, in accordance with one or more example embodiments of the disclosure. In one embodiment, a map of the electric field strength can be represented by the map 303 of the electric field. In one embodiment, the map 303 can have a normalized intensity of between 20 and approximately 134 units. In one embodiment, a gate corner 313 is shown in the plot 300 of the electrical field for a transistor comprising a non-vertical gate 302. The intensity of the electrical field (as represented by the contour plot of the electrical field near the gate corner 313) can have a smaller area of high intensity (for example, an intensity of 11.2 units and above), as compared, for example, to a similar area of the gate corner 315 of the contour plot 301 of an electric field for a transistor comprising a vertical gate 305. In one embodiment, this reduction of the electrical field strength at the gate corner 313 can be due to the reduction of the angle in the corner 313 for the non-vertical gate corner 313 as compared to the perpendicular angle of the corner 315 of plot 301 of an electric field for a transistor comprising a vertical gate 305.

FIG. 3B shows a plot 301 of an electrical field for a transistor comprising a vertical gate 305 in accordance with one or more example embodiments of the disclosure. In one embodiment, a map of the electric field strength can be represented by the map 303 of the electric field. In one embodiment, the map 303 can have a normalized intensity of between 20 and approximately 134 units. In one embodiment, the gate corner 315 is shown for the plot 301 of the electrical field for a transistor comprising a non-vertical gate 305. The intensity of the electrical field (as represented by the contour plot of the electrical field near the gate corner 315) can have a larger area of high intensity (for example, an intensity of 11.2 units and above), as compared, for example, to a similar area of the gate corner 313 of the contour plot 300 of an electric field for a transistor comprising a non-vertical gate 302. In one embodiment, this reduction of the electrical field strength at the gate corner 313 can be due to the reduction of the angle in the corner 313 for the non-vertical gate corner 313 as compared to the perpendicular angle of the corner 315 of plot 301 of an electric field for a transistor comprising a vertical gate 305.

Figure 4:
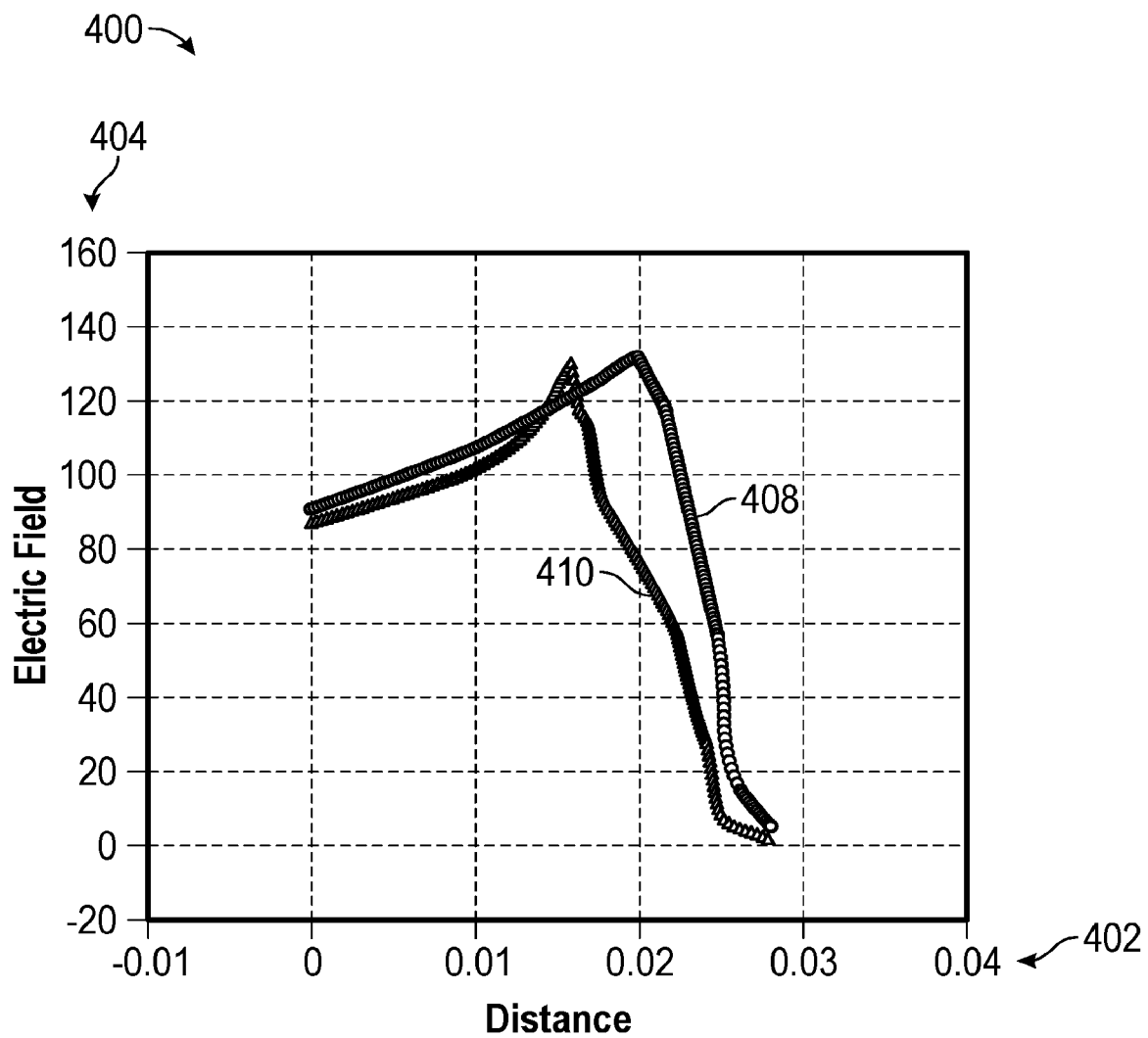
FIG. 4 shows a plot of the electrical field of transistors having vertical gates and non-vertical gates in accordance with one or more example embodiments of the disclosure.

FIG. 4 shows a plot 400 of the electrical field of transistors having vertical gates and non-vertical gates in accordance with one or more example embodiments of the disclosure. In one embodiment, the plot 400 comprises an x-axis 402 that represents the distance in a given dimension, for example, the x dimension of FIG. 1 and/or FIG. 2, in normalized units. In one embodiment, the plot 400 comprises a y-axis 404 that represents the electric field strength, in normalized units. In one embodiment, the plot 400 can represent a comparison of the electric field over a horizontal cut line running through the peak electric field locations of the plot 300 of FIG. 3. In another embodiment, the plot 400 shows a curve 408 representing an electrical field strength for a transistor including a vertical gate, for example, as shown and described in connection with FIG. 1. In one embodiment, the plot 400 shows a curve 410 representing the electric field strength for a transistor including a non-vertical gate, as shown and described in connection with FIGS. 2A-2B. In one embodiment, the integral of the curve 408 (representing transistors having a vertical gate) and 410 (representing transistors having a non-vertical gate) can be taken to have an indication of the relative electrical field strength for the transistors having a vertical gate and a non-vertical gate, respectively. As is shown if FIG. 4, transistors having a non-vertical gate, that is, transistors represented by the curve 410 show a smaller area under the curve and, therefore, a total electric field that is lower than transistors having a vertical gate as is represented by the curve 408. In another embodiment, the transistors represented by the curve 410 have similar peak electric field to the transistors represented by the curve 408, but has a smaller high field regions. In one embodiment, to the first order, the BTBT and/or GIDL current should be proportional to the area of high field regions, so on the transistors represented by the curve 410 can have lower BTBT and/or GIDL current.

Figure 5:
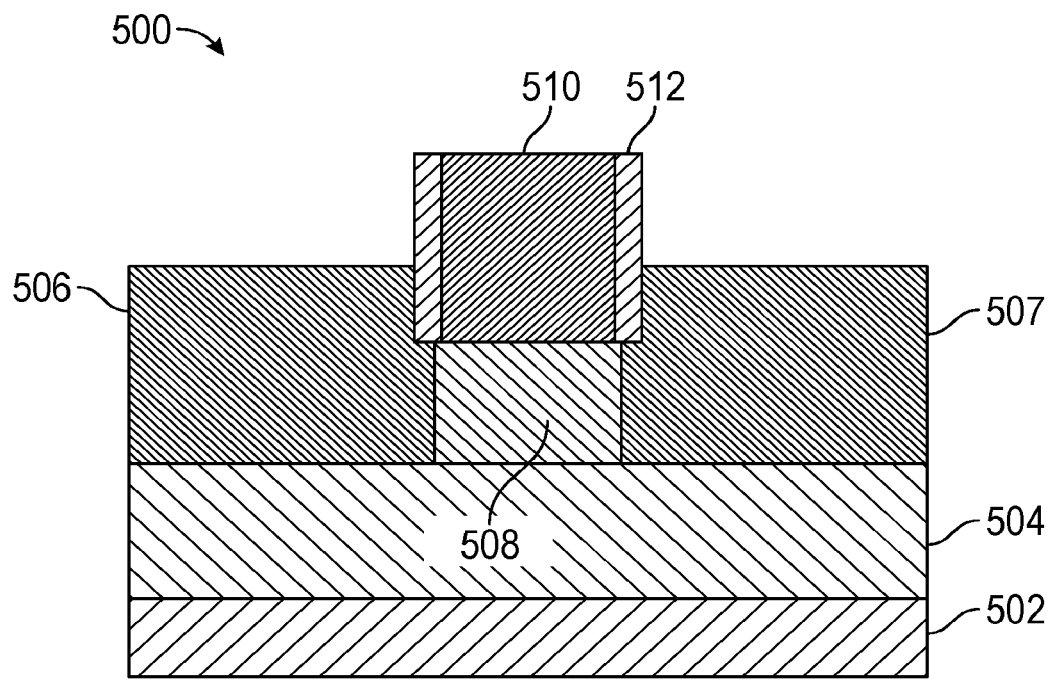
FIG. 5 shows a diagram of a partial structure of a transistor for the fabrication of a non-vertical gate, in accordance with one or more example embodiments of the disclosure.

FIG. 5 shows a diagram of a partial structure of a transistor 500 for the fabrication of a non-vertical gate, in accordance with one or more example embodiments of the disclosure. In one embodiment, the transistor 500 can include a substrate 502. In one embodiment, the substrate 502 can refer to a solid (usually planar) substance onto which a layer of another substance is applied, and to which that second substance adheres. In another embodiment, the substrate 502 can include a silicon substrate. In one embodiment, the substrate 502 can include a p-doped silicon substrate. In one embodiment, the substrate 502 can be a thin slice of material such as silicon, silicon oxide, silicon dioxide, aluminum oxide, sapphire, an alloy of silicon and germanium, and/or indium phosphide (InP), and the like. In one embodiment, the substrate 502 can include a semiconductor material (e.g., monocrystalline silicon, germanium, silicon germanium, SiGe, and/or a III-V materials based material (e.g., gallium arsenide, GaAs), or any combination thereof).

In another embodiment, the transistor 500 can include a buffer layer 504. In one embodiment, the buffer layer 504 can include any material suitable to insulate adjacent devices and prevent current leakage. In one embodiment, the buffer layer 504 can include a shallow trench isolation (STI) layer. In one embodiment, the STI layer can provide field isolation regions that isolate one fin from other fins (not shown), for example, other fins on adjacent device. In one embodiment, the buffer layer 504 can include an oxide layer (e.g., silicon dioxide), or any other electrically insulating layer. In one embodiment, the buffer layer 504 can include an interlayer dielectric (ILD), such as silicon dioxide. In one embodiment, the buffer layer 504 may include polyimide, epoxy, photodefinable materials (for example, benzocyclobutene (BCB)), WPR-series materials, and/or spin-on-glass. In one embodiment, the buffer layer 504 can include a low permittivity (low-k) ILD layer. In one embodiment, low-k can refer to dielectrics having a dielectric constant (permittivity k) lower than the permittivity of silicon dioxide. In one embodiment, the thickness of the buffer layer 504 can be approximately 10 nm to approximately 200 nm, with an example thicknesses of approximately 50 nm to approximately 100 nm. In one embodiment, the buffer layer 504 can be deposited using PVD, CVD and/or ALD, and the like.

In one embodiment, the transistor 500 can include a source 506. In another embodiment, the source 506 can include an N doped Indian Gallium Arsenide layer material. In one embodiment, the source 506 can include silicon. In another embodiment, the silicon material may be n-doped. In another embodiment, the source 506 can be fabricated using MBE. In another embodiment, the source 506 can include doped or undoped black phosphorous, titanium, tantalum, cobalt, molybdenum, titanium nitride, tantalum nitride, hafnium, copper, gadolinium, and the like. In one embodiment, the source 506 can include silicon, germanium, silicon germanium (SiGe), indium phosphide (InP), indium arsenide (InAs), indium gallium arsenide (InGaAs), gallium nitride (GaN), amorphous semiconductors such as zinc oxide (ZnO), indium gallium zinc oxide (IGZO), amorphous silicon (a-Si), amorphous germanium (a-Ge), polycrystalline germanium, polycrystalline silicon, and/or polycrystalline InGaAs, and the like. In one embodiment, the doping can include generating electron vacancies in the source 506. In one embodiment, source can include gettering materials. In one embodiment, the gettering materials can getter sulfur. In one embodiment, the source 506 can be doped, for example, by creating vacancies of sulfur and selenium. In one embodiment, the source 506 can be doped with oxygen vacancies if the source comprises an oxide or a multi-material system. In another embodiment, the source can be doped with phosphorous, boron, aluminum, tin, hafnium, titanium, copper, indium, and/or arsenic if the source 506 comprises a non-oxide a single-material semiconductor. In another embodiment, the source 506 can be approximately 1 nanometer to approximately 75 nm thick (y dimension), with example thicknesses of approximately 20 nm to approximately 30 nm thick (y dimension). In one embodiment, the source 506 can be deposited using PVD, CVD, MOCVD, MBE, and/or ALD, and the like.

In one embodiment, the transistor 500 can include a drain 507. In another embodiment, the drain 507 can include an N doped Indian Gallium Arsenide layer material. In one embodiment, the device 500 can include a drain 507. In one embodiment, the drain 208 can be deposited using a mask. In one embodiment, the drain 507 can include silicon. In another embodiment, the silicon material may be n-doped. In another embodiment, the drain 507 can be fabricated using MBE. In another embodiment, the drain 507 can include can include doped or undoped black phosphorous, titanium, tantalum, cobalt, molybdenum, titanium nitride, tantalum nitride, hafnium, copper, gadolinium, and the like. In one embodiment, the doping can include generating electron vacancies in the drain 507. In one embodiment, the drain 507 can include silicon, germanium, silicon germanium (SiGe), indium phosphide (InP), indium arsenide (InAs), indium gallium arsenide (InGaAs), gallium nitride (GaN), amorphous semiconductors such as zinc oxide (ZnO), indium gallium zinc oxide (IGZO), amorphous silicon (a-Si), amorphous germanium (a-Ge), polycrystalline germanium, polycrystalline silicon, and/or polycrystalline InGaAs, and the like. In one embodiment, the drain can include gettering materials. In one embodiment, the gettering materials can getter sulfur. In one embodiment, the drain can be doped with oxygen vacancies if the source comprises an oxide or a multi-material system. In another embodiment, the source can be doped with phosphorous, boron, aluminum, tin, hafnium, titanium, copper, indium, and/or arsenic if the drain comprises a non-oxide a single-material semiconductor. In one embodiment, the drain 507 can have a thickness of approximately 0.5 nm to approximately 100 nm (in the x or y dimensions), with example thicknesses of approximately 0.5 nm to approximately 20 nm (in the x or y dimensions). In one embodiment, the drain 507 can be deposited using PVD, CVD, MOCVD, MBE, and/or ALD, and the like. In one embodiment, the source 506 and drain 507 can include the same material, except that the source 507 can be treated to remove some of the sulfur and/or selenium.

In one embodiment, the transistor 500 can include a channel 508. In another embodiment, the channel 508 can include an Indian Gallium Arsenide material. In one embodiment, the channel 508 can include silicon. In another embodiment, the channel 508 can include intrinsic silicon. In one embodiment, the channel 508 can be deposited using MBE. In another embodiment, the channel 508 can include black phosphorous, amorphous silicon, germanium, carbon nanotube, and the like. In one embodiment, the channel 508 can include silicon, germanium, silicon germanium (SiGe), indium phosphide (InP), indium arsenide (InAs), indium gallium arsenide (InGaAs), gallium nitride (GaN), amorphous semiconductors such as zinc oxide (ZnO), indium gallium zinc oxide (IGZO), amorphous silicon (a-Si), amorphous germanium (a-Ge), polycrystalline germanium, polycrystalline silicon, and/or polycrystalline InGaAs, and the like. In one embodiment, the channel width can depend on the technology used to generate the transistor. In another embodiment, the channel 508 can be approximately 0.5 nm to approximately 200 nm long (in the y-dimension), with example thicknesses of approximately 60 nm to approximately 80 nm long (in the y-dimension). In one embodiment, the channel width can be approximately 200 nm down to approximately 5 nm (in the x-dimension). In one embodiment, the channel 508 can be deposited using PVD, CVD, MOCVD, MBE, and/or ALD, and the like.

In an embodiment, the transistor 500 can include a dummy gate 510. In another embodiment, the dummy gate 510 can include a polysilicon material. In one embodiment, the dummy gate 510 can serve as a temporary placeholder for the eventual deposition of a gate and/or gate dielectric, to be further described below.

In one embodiment, the transistor 500 can include spacer 512. In another embodiment, spacer 512 can include an oxide. In one embodiment, the oxide can include an interlayer dielectric (ILD) material. In another embodiment, ILD can include silicon dioxide ($SiO_2$), or a low-K material. In one embodiment, the oxide can be deposited using PVD, CVD, MOCVD, and/or ALD, and the like.

Figure 6:
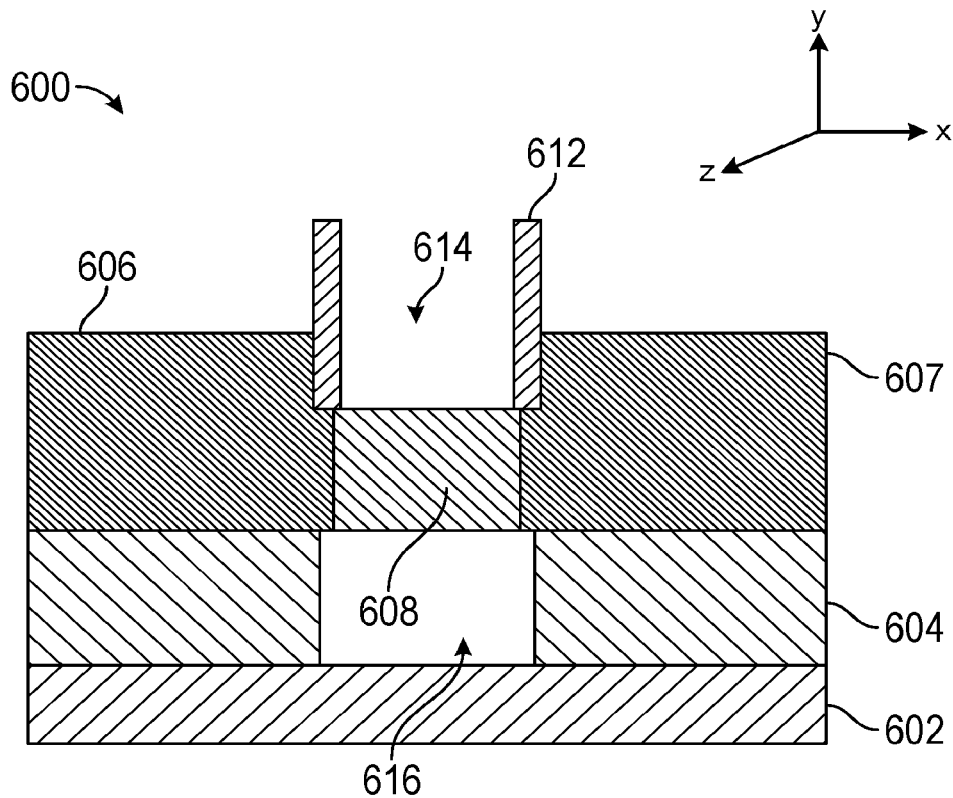
FIG. 6 shows a diagram of another partial structure of a transistor for the fabrication of a non-vertical gate, in accordance with one or more example embodiments of the disclosure.

FIG. 6 shows a diagram of a partial structure of a transistor 600 for the fabrication of a non-vertical gate, in accordance with one or more example embodiments of the disclosure. In one embodiment, the transistor 600 can include a first recess 614. In another embodiment, the transistor 600 can include a second recess 616.

In one embodiment, recess 614 and/or 616 that can be generated by the removal of the dummy gate 510 as shown and described in connection with FIG. 5. In one embodiment, the removal of the portion of the dummy gate 510 can be performed using an etching process. In one embodiment, the etching process can include, for example, a dry etch. In one embodiment, the dry etch can include, for example, a plasma-based and/or a mechanical-based etch. In one embodiment, the etching process can include, for example, a wet etch. The wet etching process can include, for example, any suitable chemicals for the removal of the dummy gate 510.

In one embodiment, the transistor 600 can include a substrate 602. In one embodiment, the substrate 602 can refer to a solid (usually planar) substance onto which a layer of another substance is applied, and to which that second substance adheres. In another embodiment, the substrate 602 can include a silicon substrate. In one embodiment, the substrate 602 can include a p-doped silicon substrate. In one embodiment, the substrate 602 can be a thin slice of material such as silicon, silicon oxide, silicon dioxide, aluminum oxide, sapphire, an alloy of silicon and germanium, and/or indium phosphide (InP), and the like. In one embodiment, the substrate 602 can include a semiconductor material (e.g., monocrystalline silicon, germanium, silicon germanium, SiGe, and/or a III-V materials based material (e.g., gallium arsenide, GaAs), or any combination thereof).

In another embodiment, the transistor 600 can include a buffer layer 604. In one embodiment, the buffer layer 604 can include any material suitable to insulate adjacent devices and prevent current leakage. In one embodiment, the buffer layer 604 can include a shallow trench isolation (STI) layer. In one embodiment, the STI layer can provide field isolation regions that isolate one fin from other fins (not shown), for example, other fins on adjacent device. In one embodiment, the buffer layer 604 can include an oxide layer (e.g., silicon dioxide), or any other electrically insulating layer. In one embodiment, the buffer layer 604 can include an interlayer dielectric (ILD), such as silicon dioxide. In one embodiment, the buffer layer 604 may include polyimide, epoxy, photodefinable materials (for example, benzocyclobutene (BCB)), WPR-series materials, and/or spin-on-glass. In one embodiment, the buffer layer 604 can include a low permittivity (low-k) ILD layer. In one embodiment, low-k can refer to dielectrics having a dielectric constant (permittivity k) lower than the permittivity of silicon dioxide. In one embodiment, the thickness of the buffer layer 604 can be approximately 10 nm to approximately 200 nm, with an example thicknesses of approximately 50 nm to approximately 100 nm. In one embodiment, the buffer layer 604 can be deposited using PVD, CVD and/or ALD, and the like.

In one embodiment, the transistor 600 can include a source 606. In another embodiment, the source 606 can include an N doped Indian Gallium Arsenide layer material. In one embodiment, the source 606 can include silicon. In another embodiment, the silicon material may be n-doped. In another embodiment, the source 606 can be fabricated using MBE. In another embodiment, the source 606 can include doped or undoped black phosphorous, titanium, tantalum, cobalt, molybdenum, titanium nitride, tantalum nitride, hafnium, copper, gadolinium, and the like. In one embodiment, the source 606 can include silicon, germanium, silicon germanium (SiGe), indium phosphide (InP), indium arsenide (InAs), indium gallium arsenide (InGaAs), gallium nitride (GaN), amorphous semiconductors such as zinc oxide (ZnO), indium gallium zinc oxide (IGZO), amorphous silicon (a-Si), amorphous germanium (a-Ge), polycrystalline germanium, polycrystalline silicon, and/or polycrystalline InGaAs, and the like. In one embodiment, the doping can include generating electron vacancies in the source 606. In one embodiment, source can include gettering materials. In one embodiment, the gettering materials can getter sulfur. In one embodiment, the source 606 can be doped, for example, by creating vacancies of sulfur and selenium. In one embodiment, the source 606 can be doped with oxygen vacancies if the source comprises an oxide or a multi-material system. In another embodiment, the source can be doped with phosphorous, boron, aluminum, tin, hafnium, titanium, copper, indium, and/or arsenic if the source 606 comprises a non-oxide a single-material semiconductor. In another embodiment, the source 606 can be approximately 1 nanometer to approximately 75 nm thick (y dimension), with example thicknesses of approximately 20 nm to approximately 30 nm thick (y dimension). In one embodiment, the source 606 can be deposited using PVD, CVD, MOCVD, MBE, and/or ALD, and the like.

In one embodiment, the transistor 600 can include a drain 607. In another embodiment, the drain 607 can include an N doped Indian Gallium Arsenide layer material. In one embodiment, the drain 607 can include silicon. In another embodiment, the silicon material may be n-doped. In another embodiment, the drain 607 can be fabricated using MBE. In another embodiment, the drain 607 can include can include doped or undoped black phosphorous, titanium, tantalum, cobalt, molybdenum, titanium nitride, tantalum nitride, hafnium, copper, gadolinium, and the like. In one embodiment, the doping can include generating electron vacancies in the drain 607. In one embodiment, the drain 607 can include silicon, germanium, silicon germanium (SiGe), indium phosphide (InP), indium arsenide (InAs), indium gallium arsenide (InGaAs), gallium nitride (GaN), amorphous semiconductors such as zinc oxide (ZnO), indium gallium zinc oxide (IGZO), amorphous silicon (a-Si), amorphous germanium (a-Ge), polycrystalline germanium, polycrystalline silicon, and/or polycrystalline InGaAs, and the like. In one embodiment, the drain 607 can include gettering materials. In one embodiment, the gettering materials can getter sulfur. In one embodiment, the drain 607 can be doped with oxygen vacancies if the source 606 comprises an oxide or a multi-material system. In another embodiment, the source can be doped with phosphorous, boron, aluminum, tin, hafnium, titanium, copper, indium, and/or arsenic if the drain 607 comprises a non-oxide a single-material semiconductor. In one embodiment, the drain 607 can have a thickness of approximately 0.5 nm to approximately 100 nm (in the x or y dimensions), with example thicknesses of approximately 0.5 nm to approximately 20 nm (in the x or y dimensions). In one embodiment, the drain 607 can be deposited using PVD, CVD, MOCVD, MBE, and/or ALD, and the like. In one embodiment, the source 606 and drain 607 can include the same material, except that the source 607 can be treated to remove some of the sulfur and/or selenium.

In one embodiment, the transistor 600 can include a channel 608. In another embodiment, the channel 608 can include an Indian Gallium Arsenide material. In one embodiment, the channel 608 can include silicon. In another embodiment, the channel 608 can include intrinsic silicon. In one embodiment, the channel 608 can be deposited using MBE. In another embodiment, the channel 608 can include black phosphorous, amorphous silicon, germanium, carbon nanotube, and the like. In one embodiment, the channel 608 can include silicon, germanium, silicon germanium (SiGe), indium phosphide (InP), indium arsenide (InAs), indium gallium arsenide (InGaAs), gallium nitride (GaN), amorphous semiconductors such as zinc oxide (ZnO), indium gallium zinc oxide (IGZO), amorphous silicon (a-Si), amorphous germanium (a-Ge), polycrystalline germanium, polycrystalline silicon, and/or polycrystalline InGaAs, and the like. In one embodiment, the channel width can depend on the technology used to generate the transistor. In another embodiment, the channel 608 can be approximately 0.5 nm to approximately 200 nm long (in the y-dimension), with example thicknesses of approximately 60 nm to approximately 80 nm long (in the y-dimension). In one embodiment, the channel width can be approximately 200 nm down to approximately 5 nm (in the x-dimension). In one embodiment, the channel 608 can be deposited using PVD, CVD, MOCVD, MBE, and/or ALD, and the like.

In one embodiment, the transistor 600 can include spacer 612. In another embodiment, spacer 612 can include an oxide. In one embodiment, the oxide can include an interlayer dielectric (ILD) material. In another embodiment, ILD can include silicon dioxide ($SiO_2$), or a low-K material. In one embodiment, the oxide can be deposited using PVD, CVD, MOCVD, and/or ALD, and the like.

Figure 7:
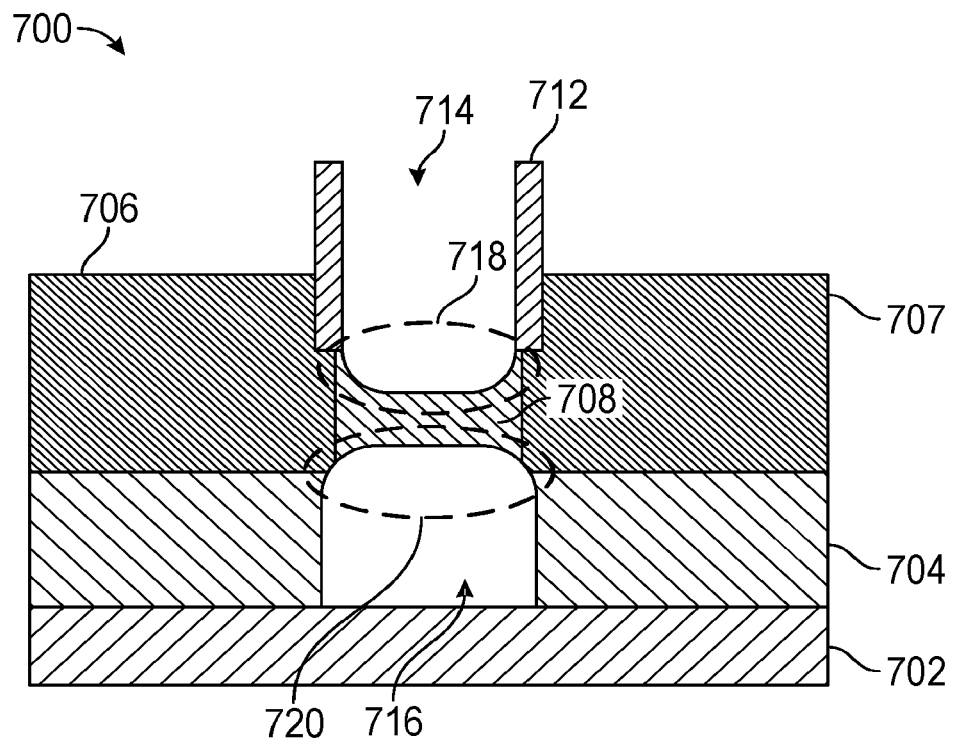
FIG. 7 shows a diagram of another partial structure of a transistor for the fabrication of a non-vertical gate, in accordance with one or more example embodiments of the disclosure.

FIG. 7 shows a diagram of a partial structure of a transistor 700 for the fabrication of a non-vertical gate, in accordance with one or more example embodiments of the disclosure.

In one embodiment, the transistor 700 can include a wide angle region 718 for a top gate or a second gate. In one embodiment, the wide-angle region 718 can be generated by an etching step applied on the channel 708. In one embodiment, the etching process can include, for example, a dry etch. In one embodiment, the dry etch can include, for example, a plasma-based and/or a mechanical-based etch. In one embodiment, the etching process can include, for example, a wet etch. The wet etching process can include, for example, any suitable chemicals for the removal of the portion of the channel 708. In a later step, a gate and the gate material can be deposited on the channel 708 including the wide-angle region 718, thereby providing a non-vertical gate.

In one embodiment, the transistor 700 can include a second wide angle region 720 for a bottom gate or a second gate. In one embodiment, the second wide-angle region 720 can be generated by an etching step applied on the channel 708. In one embodiment, the etching process can include, for example, a dry etch. In one embodiment, the dry etch can include, for example, a plasma-based and/or a mechanical-based etch. In one embodiment, the etching process can include, for example, a wet etch. The wet etching process can include, for example, any suitable chemicals for the removal of the portion of the channel 708. In a later step, a gate and the gate material can be deposited on the channel 708 including the second wide-angle region 720, thereby providing a non-vertical gate.

In one embodiment, recess 714 that can be generated by the removal of the dummy gate 510 as shown and described in connection with FIG. 5. In one embodiment, the removal of the portion of the dummy gate 510 can be performed using an etching process. In one embodiment, the etching process can include, for example, a dry etch. dummy gate 510. In one embodiment, the etching process can include, for example, a wet etch. The wet etching process can include, for example, any suitable chemicals for the removal of dummy gate 510. For example, for a dummy gate 510 comprising gallium arsenide, an acid based wet etch may be used.

In one embodiment, the transistor 700 can include a substrate 702. In one embodiment, the substrate 702 can refer to a solid (usually planar) substance onto which a layer of another substance is applied, and to which that second substance adheres. In another embodiment, the substrate 702 can include a silicon substrate. In one embodiment, the substrate 702 can include a p-doped silicon substrate. In one embodiment, the substrate 702 can be a thin slice of material such as silicon, silicon oxide, silicon dioxide, aluminum oxide, sapphire, an alloy of silicon and germanium, and/or indium phosphide (InP), and the like. In one embodiment, the substrate 702 can include a semiconductor material (e.g., monocrystalline silicon, germanium, silicon germanium, SiGe, and/or a III-V materials based material (e.g., gallium arsenide, GaAs), or any combination thereof).

In another embodiment, the transistor 700 can include a buffer layer 704. In one embodiment, the buffer layer 704 can include any material suitable to insulate adjacent devices and prevent current leakage. In one embodiment, the buffer layer 704 can include a shallow trench isolation (STI) layer. In one embodiment, the STI layer can provide field isolation regions that isolate one fin from other fins (not shown), for example, other fins on adjacent device. In one embodiment, the buffer layer 704 can include an oxide layer (e.g., silicon dioxide), or any other electrically insulating layer. In one embodiment, the buffer layer 704 can include an interlayer dielectric (ILD), such as silicon dioxide. In one embodiment, the buffer layer 704 may include polyimide, epoxy, photodefinable materials (for example, benzocyclobutene (BCB)), WPR-series materials, and/or spin-on-glass. In one embodiment, the buffer layer 704 can include a low permittivity (low-k) ILD layer. In one embodiment, low-k can refer to dielectrics having a dielectric constant (permittivity k) lower than the permittivity of silicon dioxide. In one embodiment, the thickness of the buffer layer 704 can be approximately 10 nm to approximately 200 nm, with an example thicknesses of approximately 50 nm to approximately 100 nm. In one embodiment, the buffer layer 704 can be deposited using PVD, CVD and/or ALD, and the like.

In one embodiment, the transistor 700 can include a source 706. In another embodiment, the source 706 can include an N doped Indian Gallium Arsenide layer material. In one embodiment, the source 706 can include silicon. In another embodiment, the silicon material may be n-doped. In another embodiment, the source 706 can be fabricated using MBE. In another embodiment, the source 706 can include doped or undoped black phosphorous, titanium, tantalum, cobalt, molybdenum, titanium nitride, tantalum nitride, hafnium, copper, gadolinium, and the like. In one embodiment, the source 606 can include silicon, germanium, silicon germanium (SiGe), indium phosphide (InP), indium arsenide (InAs), indium gallium arsenide (InGaAs), gallium nitride (GaN), amorphous semiconductors such as zinc oxide (ZnO), indium gallium zinc oxide (IGZO), amorphous silicon (a-Si), amorphous germanium (a-Ge), polycrystalline germanium, polycrystalline silicon, and/or polycrystalline InGaAs, and the like. In one embodiment, the doping can include generating electron vacancies in the source 706. In one embodiment, the source 706 can include gettering materials. In one embodiment, the gettering materials can getter sulfur. In one embodiment, the source 706 can be doped, for example, by creating vacancies of sulfur and selenium. In one embodiment, the source 706 can be doped with oxygen vacancies if the source comprises an oxide or a multi-material system. In another embodiment, the source can be doped with phosphorous, boron, aluminum, tin, hafnium, titanium, copper, indium, and/or arsenic if the source 706 comprises a non-oxide a single-material semiconductor. In another embodiment, the source 706 can be approximately 1 nanometer to approximately 75 nm thick (y dimension), with example thicknesses of approximately 20 nm to approximately 30 nm thick (y dimension). In one embodiment, the source 706 can be deposited using PVD, CVD, MOCVD, MBE, and/or ALD, and the like.

In one embodiment, the transistor 600 can include a drain 607. In another embodiment, the drain 707 can include an n-doped Indian Gallium Arsenide layer material. In one embodiment, the drain 707 can include silicon. In another embodiment, the silicon material may be n-doped. In another embodiment, the drain 707 can be fabricated using MBE. In another embodiment, the drain 707 can include can include doped or undoped black phosphorous, titanium, tantalum, cobalt, molybdenum, titanium nitride, tantalum nitride, hafnium, copper, gadolinium, and the like. In one embodiment, the doping can include generating electron vacancies in the drain 707. In one embodiment, the drain 707 can include silicon, germanium, silicon germanium (SiGe), indium phosphide (InP), indium arsenide (InAs), indium gallium arsenide (InGaAs), gallium nitride (GaN), amorphous semiconductors such as zinc oxide (ZnO), indium gallium zinc oxide (IGZO), amorphous silicon (a-Si), amorphous germanium (a-Ge), polycrystalline germanium, polycrystalline silicon, and/or polycrystalline InGaAs, and the like. In one embodiment, the drain 707 can include gettering materials. In one embodiment, the gettering materials can getter sulfur. In one embodiment, the drain 707 can be doped with oxygen vacancies if the source 706 comprises an oxide or a multi-material system. In another embodiment, the source can be doped with phosphorous, boron, aluminum, tin, hafnium, titanium, copper, indium, and/or arsenic if the drain 707 comprises a non-oxide a single-material semiconductor. In one embodiment, the drain 707 can have a thickness of approximately 0.5 nm to approximately 100 nm (in the x or y dimensions), with example thicknesses of approximately 0.5 nm to approximately 20 nm (in the x or y dimensions). In one embodiment, the drain 707 can be deposited using PVD, CVD, MOCVD, MBE, and/or ALD, and the like. In one embodiment, the source 706 and drain 707 can include the same material, except that the source 707 can be treated to remove some of the sulfur and/or selenium.

In one embodiment, the transistor 700 can include a channel 708. In another embodiment, the channel 708 can include an Indian Gallium Arsenide material. In one embodiment, the channel 708 can include silicon. In another embodiment, the channel 708 can include intrinsic silicon. In one embodiment, the channel 708 can be deposited using MBE. In another embodiment, the channel 708 can include black phosphorous, amorphous silicon, germanium, carbon nanotube, and the like. In one embodiment, the channel 708 can include silicon, germanium, silicon germanium (SiGe), indium phosphide (InP), indium arsenide (InAs), indium gallium arsenide (InGaAs), gallium nitride (GaN), amorphous semiconductors such as zinc oxide (ZnO), indium gallium zinc oxide (IGZO), amorphous silicon (a-Si), amorphous germanium (a-Ge), polycrystalline germanium, polycrystalline silicon, and/or polycrystalline InGaAs, and the like. In one embodiment, the channel width can depend on the technology used to generate the transistor. In another embodiment, the channel 708 can be approximately 0.5 nm to approximately 200 nm long (in the y-dimension), with example thicknesses of approximately 60 nm to approximately 80 nm long (in the y-dimension). In one embodiment, the channel width can be approximately 200 nm down to approximately 5 nm (in the x-dimension). In one embodiment, the channel 708 can be deposited using PVD, CVD, MOCVD, MBE, and/or ALD, and the like.

In one embodiment, the transistor 700 can include spacer 712. In another embodiment, spacer 712 can include an oxide. In one embodiment, the oxide can include an interlayer dielectric (ILD) material. In another embodiment, ILD can include silicon dioxide ($SiO_2$), or a low-K material. In one embodiment, the spacer 712 can be deposited using PVD, CVD, MOCVD, and/or ALD, and the like.

Figure 8:
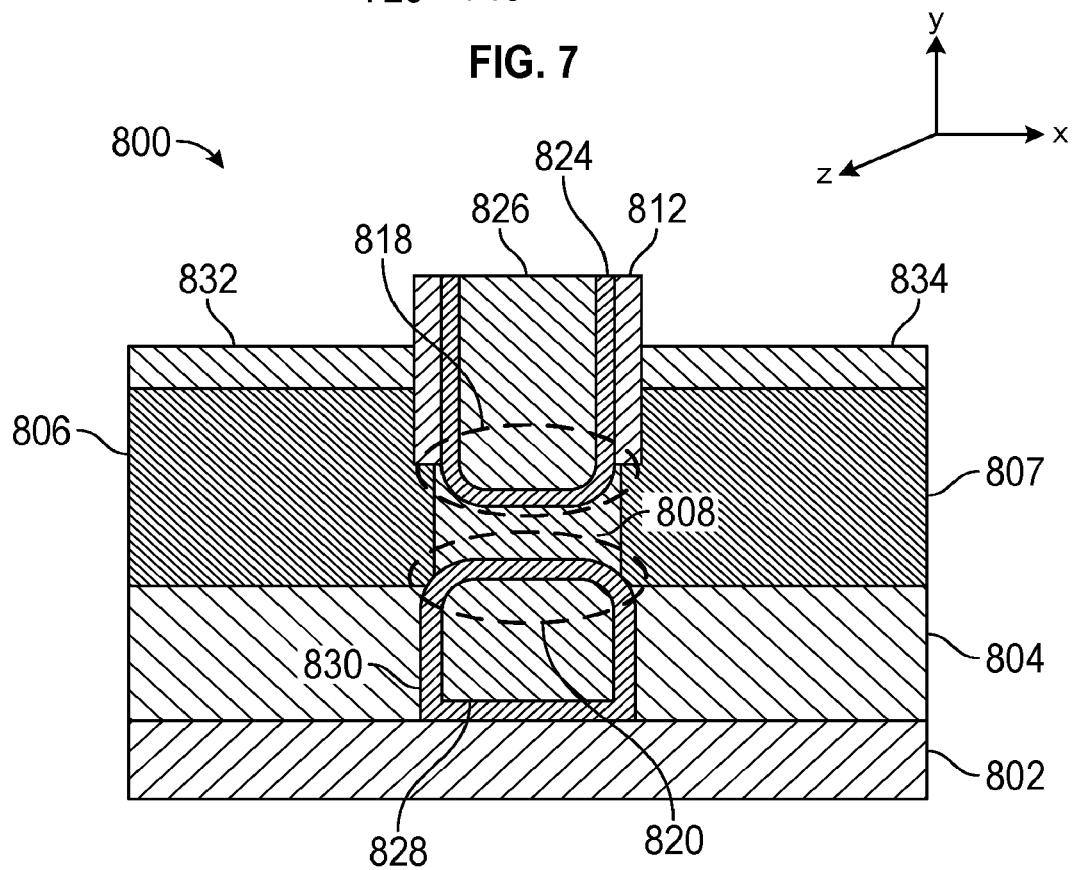
FIG. 8 shows a diagram of another partial structure of a transistor for the fabrication of a non-vertical gate, in accordance with one or more example embodiments of the disclosure.

FIG. 8 shows a diagram of a partial structure of a transistor 800 for the fabrication of a non-vertical gate, in accordance with one or more example embodiments of the disclosure.

In one embodiment, the transistor 800 can include a gate material 824 for a top gate, that can be deposited into the recesses similar to recesses 614 and 616 having wide angle regions 718 and 720 as shown and described in connection with FIGS. 6 and 7. In one embodiment, the transistor 800 can include a gate material 826 for a bottom gate, that can be deposited into the recesses similar to recesses 614 and 616 having wide angle regions 718 and 720 as shown and described in connection with FIGS. 6 and 7.

In one embodiment, the gate material 824 and/or 830 can include a high-K dielectric material. In another embodiment, the high-K material, for example, hafnium oxide, tantalum oxide, titanium oxide, aluminum oxide, silicon dioxide, silicon nitride and the like. In another embodiment, the gate material 824 and/or 830 can include silicon oxide, which may not be a high-K material. In one embodiment, an electroglass (EG) can be used as the gate material 824 and/or 830. In one embodiment, the gate material 824 and/or 830 can include hydrogenated boron nitride (HBN). In one embodiment, the gate material 824 and/or 830 can be deposited using PVD, CVD, MOCVD, MBE, and/or ALD, and the like. In one embodiment, the gate material 824 and/or 830 can have a width of 0.5 nm to approximately 20 nm (x-dimension). In another embodiment, the gate material 824 and/or 830 can have a thickness of approximately 0.5 nm to approximately 100 nm (in the y dimension).

In one embodiment, the transistor 800 can include a gate 826 for a top gate that can be deposited into the recesses similar to recesses 614 and 616 having wide angle regions 718 and 720 as shown and described in connection with FIGS. 6 and 7. In one embodiment, the transistor 800 can include a gate 828 for a bottom gate that can be deposited into the recesses similar to recesses 614 and 616 having wide angle regions 718 and 720 as shown and described in connection with FIGS. 6 and 7. In another embodiment, the gate 826 and 828 can include a metal. In another embodiment, the gate 826 and 828 can include a transition metal. In one embodiment, the gate 826 and 828 can be used to tune the threshold voltage of the device. In one embodiment, gate 826 and 828 can include titanium nitride, cobalt, tungsten and/or platinum. In one embodiment, the gate 826 and 828 can be deposited using PVD, CVD, MOCVD, MBE and/or ALD, and the like. In one embodiment, the gate 826 and 828 can have a width of approximately 10 nm to approximately 150 nm (x-dimension). In another embodiment, the gate 826 and 828 can have a length of approximately 10 nm to approximately 150 nm (y-dimension).

In one embodiment, the transistor 800 can include a source contact 832. In one embodiment, the transistor 800 can include a drain contact 834. In one embodiment, the source contact 832 and/or the drain contact 834 can include a metal. In one embodiment, the metal can include gold, copper, silver, aluminum, zinc, tin, platinum, and any of the like. The source contact 832 and/or the drain contact 834 can include any alloys of such materials. In one embodiment, the source contact 832 and/or the drain contact 834 can have a thickness of approximately 2 nm to approximately 100 nm (in the x or y dimensions), with example thicknesses of approximately 5 nm to approximately 20 nm (in the x or y dimensions). In one embodiment, the source contact 832 and/or the drain contact 834 can be deposited using PVD, CVD, MOCVD, MBE, and/or ALD, and the like.

In one embodiment, the transistor 800 can include a wide angle region 818 for a top gate or a second gate. In one embodiment, the transistor 800 can include a wide angle region 820 for a bottom gate or a second gate. In one embodiment, the wide-angle region 818 can be generated by an etching step applied on the channel 808. In one embodiment, the etching process can include, for example, a dry etch. In one embodiment, the dry etch can include, for example, a plasma-based and/or a mechanical-based etch. In one embodiment, the etching process can include, for example, a wet etch. The wet etching process can include, for example, any suitable chemicals for the removal of the portion of the channel 808. In a later step, a gate and the gate material can be deposited on the channel 808 including the wide-angle region 818, thereby providing a non-vertical gate.

In one embodiment, the transistor 800 can include a substrate 802. In one embodiment, the substrate 802 can refer to a solid (usually planar) substance onto which a layer of another substance is applied, and to which that second substance adheres. In another embodiment, the substrate 802 can include a silicon substrate. In one embodiment, the substrate 802 can include a p-doped silicon substrate. In one embodiment, the substrate 802 can be a thin slice of material such as silicon, silicon oxide, silicon dioxide, aluminum oxide, sapphire, an alloy of silicon and germanium, and/or indium phosphide (InP), and the like. In one embodiment, the substrate 802 can include a semiconductor material (e.g., monocrystalline silicon, germanium, silicon germanium, SiGe, and/or a III-V materials based material (e.g., gallium arsenide, GaAs), or any combination thereof).

In another embodiment, the transistor 800 can include a buffer layer 804. In one embodiment, the buffer layer 804 can include any material suitable to insulate adjacent devices and prevent current leakage. In one embodiment, the buffer layer 804 can include a shallow trench isolation (STI) layer. In one embodiment, the STI layer can provide field isolation regions that isolate one fin from other fins (not shown), for example, other fins on adjacent device. In one embodiment, the buffer layer 804 can include an oxide layer (e.g., silicon dioxide), or any other electrically insulating layer. In one embodiment, the buffer layer 804 can include an interlayer dielectric (ILD), such as silicon dioxide. In one embodiment, the buffer layer 804 may include polyimide, epoxy, photodefinable materials (for example, benzocyclobutene (BCB)), WPR-series materials, and/or spin-on-glass. In one embodiment, the buffer layer 804 can include a low permittivity (low-k) ILD layer. In one embodiment, low-k can refer to dielectrics having a dielectric constant (permittivity k) lower than the permittivity of silicon dioxide. In one embodiment, the thickness of the buffer layer 804 can be approximately 10 nm to approximately 200 nm, with an example thicknesses of approximately 20 nm to approximately 100 nm. In one embodiment, the buffer layer 804 can be deposited using PVD, CVD and/or ALD, and the like.

In one embodiment, the transistor 800 can include a source 806. In another embodiment, the source 806 can include an N doped Indian Gallium Arsenide layer material. In one embodiment, the source 806 can include silicon. In another embodiment, the silicon material may be n-doped. In another embodiment, the source 806 can be fabricated using MBE. In another embodiment, the source 806 can include doped or undoped black phosphorous, titanium, tantalum, cobalt, molybdenum, titanium nitride, tantalum nitride, hafnium, copper, gadolinium, and the like. In one embodiment, the source 806 can include silicon, germanium, silicon germanium (SiGe), indium phosphide (InP), indium arsenide (InAs), indium gallium arsenide (InGaAs), gallium nitride (GaN), amorphous semiconductors such as zinc oxide (ZnO), indium gallium zinc oxide (IGZO), amorphous silicon (a-Si), amorphous germanium (a-Ge), polycrystalline germanium, polycrystalline silicon, and/or polycrystalline InGaAs, and the like. In one embodiment, the doping can include generating electron vacancies in the source 806. In one embodiment, the source 806 can include gettering materials. In one embodiment, the gettering materials can getter sulfur. In one embodiment, the source 806 can be doped, for example, by creating vacancies of sulfur and selenium. In one embodiment, the source 806 can be doped with oxygen vacancies if the source comprises an oxide or a multi-material system. In another embodiment, the source can be doped with phosphorous, boron, aluminum, tin, hafnium, titanium, copper, indium, and/or arsenic if the source 806 comprises a non-oxide a single-material semiconductor. In another embodiment, the source 806 can be approximately 1 nanometer to approximately 75 nm thick (y dimension), with example thicknesses of approximately 20 nm to approximately 30 nm thick (y dimension). In one embodiment, the source 806 can be deposited using PVD, CVD, MOCVD, MBE, and/or ALD, and the like.

In one embodiment, the transistor 800 can include a drain 807. In another embodiment, the drain 807 can include an N doped Indian Gallium Arsenide layer material. In one embodiment, the drain 807 can include silicon. In another embodiment, the silicon material may be n-doped. In another embodiment, the drain 807 can be fabricated using MBE. In another embodiment, the drain 807 can include can include doped or undoped black phosphorous, titanium, tantalum, cobalt, molybdenum, titanium nitride, tantalum nitride, hafnium, copper, gadolinium, and the like. In one embodiment, the doping can include generating electron vacancies in the drain 807. In one embodiment, the drain 807 can include silicon, germanium, silicon germanium (SiGe), indium phosphide (InP), indium arsenide (InAs), indium gallium arsenide (InGaAs), gallium nitride (GaN), amorphous semiconductors such as zinc oxide (ZnO), indium gallium zinc oxide (IGZO), amorphous silicon (a-Si), amorphous germanium (a-Ge), polycrystalline germanium, polycrystalline silicon, and/or polycrystalline InGaAs, and the like. In one embodiment, the drain 807 can include gettering materials. In one embodiment, the gettering materials can getter sulfur. In one embodiment, the drain 807 can be doped with oxygen vacancies if the source 806 comprises an oxide or a multi-material system. In another embodiment, the source can be doped with phosphorous, boron, aluminum, tin, hafnium, titanium, copper, indium, and/or arsenic if the drain 807 comprises a non-oxide a single-material semiconductor. In one embodiment, the drain 807 can have a thickness of approximately 0.5 nm to approximately 100 nm (in the x or y dimensions), with example thicknesses of approximately 0.5 nm to approximately 20 nm (in the x or y dimensions). In one embodiment, the drain 807 can be deposited using PVD, CVD, MOCVD, MBE, and/or ALD, and the like. In one embodiment, the source 806 and drain 807 can include the same material, except that the source 807 can be treated to remove some of the sulfur and/or selenium.

In one embodiment, the transistor 800 can include a channel 808. In another embodiment, the channel 508 can include an Indian Gallium Arsenide material. In one embodiment, the channel 808 can include silicon. In another embodiment, the channel 808 can include intrinsic silicon. In one embodiment, the channel 808 can be deposited using MBE. In another embodiment, the channel 808 can include black phosphorous, amorphous silicon, germanium, carbon nanotube, and the like. In one embodiment, the channel 808 can include silicon, germanium, silicon germanium (SiGe), indium phosphide (InP), indium arsenide (InAs), indium gallium arsenide (InGaAs), gallium nitride (GaN), amorphous semiconductors such as zinc oxide (ZnO), indium gallium zinc oxide (IGZO), amorphous silicon (a-Si), amorphous germanium (a-Ge), polycrystalline germanium, polycrystalline silicon, and/or polycrystalline InGaAs, and the like. In one embodiment, the channel width can depend on the technology used to generate the transistor. In another embodiment, the channel 808 can be approximately 0.5 nm to approximately 200 nm long (in the y-dimension), with example thicknesses of approximately 60 nm to approximately 80 nm long (in the y-dimension). In one embodiment, the channel width can be approximately 200 nm down to approximately 5 nm (in the x-dimension). In one embodiment, the channel 808 can be deposited using PVD, CVD, MOCVD, MBE, and/or ALD, and the like.

In one embodiment, the transistor 800 can include spacer 812. In another embodiment, spacer 812 can include an oxide. In one embodiment, the oxide can include an interlayer dielectric (ILD) material. In another embodiment, ILD can include silicon dioxide (SiO$_2$), or a low-K material. In one embodiment, the spacer 812 can be deposited using PVD, CVD, MOCVD, and/or ALD, and the like.

Figure 9:
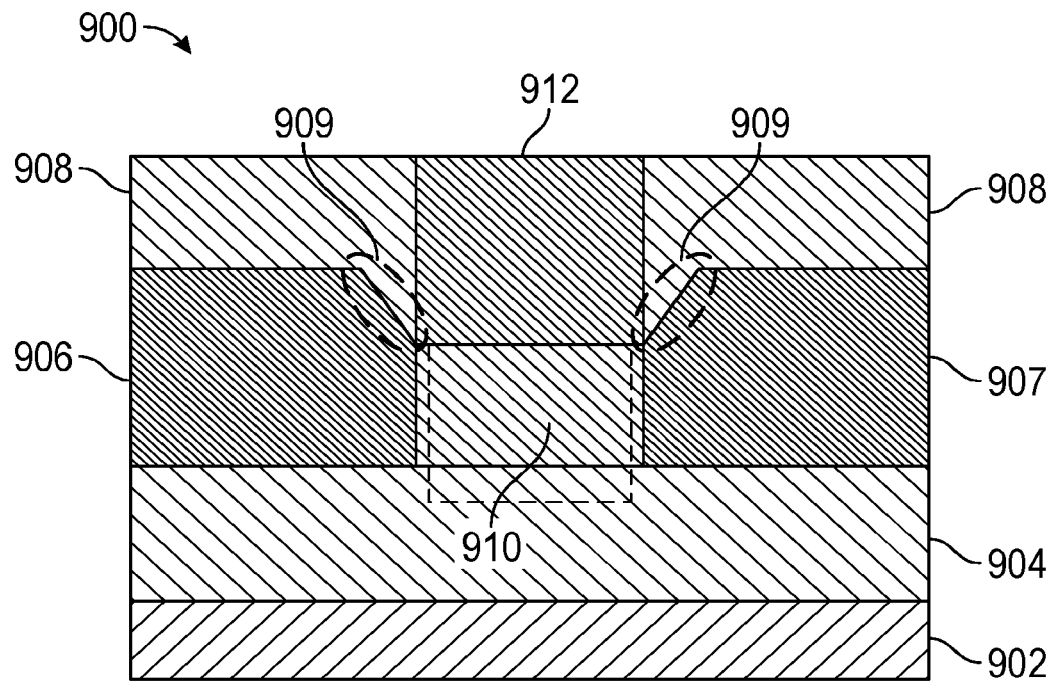
FIG. 9 shows a diagram of a partial structure of a transistor for the fabrication of a non-vertical gate, in accordance with one or more example embodiments of the disclosure.

FIG. 9 shows a diagram of a partial structure of a transistor 900 for the fabrication of a non-vertical gate, in accordance with one or more example embodiments of the disclosure. In one embodiment, the transistor 900 can include a substrate 902. In one embodiment, the substrate 902 can refer to a solid (usually planar) substance onto which a layer of another substance is applied, and to which that second substance adheres. In another embodiment, the substrate 902 can include a silicon substrate. In one embodiment, the substrate 902 can include a p-doped silicon substrate. In one embodiment, the substrate 902 can be a thin slice of material such as silicon, silicon oxide, silicon dioxide, aluminum oxide, sapphire, an alloy of silicon and germanium, and/or indium phosphide (InP), and the like. In one embodiment, the substrate 902 can include a semiconductor material (e.g., monocrystalline silicon, germanium, silicon germanium, SiGe, and/or a III-V materials based material (e.g., gallium arsenide, GaAs), or any combination thereof).

In another embodiment, the transistor 900 can include a buffer 904. In one embodiment, the buffer layer 904 can include any material suitable to insulate adjacent devices and prevent current leakage. In one embodiment, the buffer layer 904 can include a STI layer. In one embodiment, the STI layer can provide field isolation regions that isolate one fin from other fins (not shown), for example, other fins on adjacent device.

In one embodiment, the buffer layer 904 can include an oxide layer (e.g., silicon dioxide), or any other electrically insulating layer. In one embodiment, the buffer layer 904 can include an interlayer dielectric (ILD), such as silicon dioxide. In one embodiment, the buffer layer 904 may include polyimide, epoxy, photodefinable materials (for example, benzocyclobutene, BCB), WPR-series materials, and/or spin-on-glass. In one embodiment, the buffer layer 904 can include a low permittivity (low-k) ILD layer. In one embodiment, low-k can refer to dielectrics having a dielectric constant (permittivity k) lower than the permittivity of silicon dioxide. In one embodiment, the thickness of the buffer layer 904 can be approximately 10 nm to approximately 200 nm, with an example thicknesses of approximately 50 nm to approximately 100 nm. In one embodiment, the buffer layer 904 can be deposited using PVD, CVD and/or ALD, and the like.

In one embodiment, the transistor 900 can include a source 906. In another embodiment, the source 906 can include an N doped Indian Gallium Arsenide material. In one embodiment, the source 906 can include silicon. In another embodiment, the silicon material may be n-doped. In another embodiment, the source 906 can be fabricated using MBE. In another embodiment, the source 906 can include doped or undoped black phosphorous, titanium, tantalum, cobalt, molybdenum, titanium nitride, tantalum nitride, hafnium, copper, gadolinium, and the like. In one embodiment, the source 906 can include silicon, germanium, silicon germanium (SiGe), indium phosphide (InP), indium arsenide (InAs), indium gallium arsenide (InGaAs), gallium nitride (GaN), amorphous semiconductors such as zinc oxide (ZnO), indium gallium zinc oxide (IGZO), amorphous silicon (a-Si), amorphous germanium (a-Ge), polycrystalline germanium, polycrystalline silicon, and/or polycrystalline InGaAs, and the like. In one embodiment, the doping can include generating electron vacancies in the source 906. In one embodiment, source can include gettering materials. In one embodiment, the gettering materials can getter sulfur. In one embodiment, the source 906 can be doped, for example, by creating vacancies of sulfur and selenium. In one embodiment, the source 906 can be doped with oxygen vacancies if the source comprises an oxide or a multi-material system. In another embodiment, the source can be doped with phosphorous, boron, aluminum, tin, hafnium, titanium, copper, indium, and/or arsenic if the source 906 comprises a non-oxide a single-material semiconductor. In another embodiment, the source 906 can be approximately 1 nanometer to approximately 75 nm thick (y dimension), with example thicknesses of approximately 20 nm to approximately 30 nm thick (y dimension). In one embodiment, the source 906 can be deposited using PVD, CVD, MOCVD, MBE, and/or ALD, and the like.

In one embodiment, the transistor 900 can include a drain 907. In another embodiment, the drain 907 can include an N doped Indian Gallium Arsenide layer material. In one embodiment, the drain 907 can include silicon. In another embodiment, the silicon material may be n-doped. In another embodiment, the drain 907 can be fabricated using MBE. In another embodiment, the drain 907 can include can include doped or undoped black phosphorous, titanium, tantalum, cobalt, molybdenum, titanium nitride, tantalum nitride, hafnium, copper, gadolinium, and the like. In one embodiment, the doping can include generating electron vacancies in the drain 907. In one embodiment, the drain 907 can include silicon, germanium, silicon germanium (SiGe), indium phosphide (InP), indium arsenide (InAs), indium gallium arsenide (InGaAs), gallium nitride (GaN), amorphous semiconductors such as zinc oxide (ZnO), indium gallium zinc oxide (IGZO), amorphous silicon (a-Si), amorphous germanium (a-Ge), polycrystalline germanium, polycrystalline silicon, and/or polycrystalline InGaAs, and the like. In one embodiment, the drain 907 can include gettering materials. In one embodiment, the gettering materials can getter sulfur. In one embodiment, the drain can be doped with oxygen vacancies if the source 907 comprises an oxide or a multi-material system. In another embodiment, the source 907 can be doped with phosphorous, boron, aluminum, tin, hafnium, titanium, copper, indium, and/or arsenic if the drain comprises a non-oxide a single-material semiconductor. In one embodiment, the drain 907 can have a thickness of approximately 0.5 nm to approximately 100 nm (in the x or y dimensions), with example thicknesses of approximately 0.5 nm to approximately 20 nm (in the x or y dimensions). In one embodiment, the drain 907 can be deposited using PVD, CVD, MOCVD, MBE, and/or ALD, and the like. In one embodiment, the source 906 and drain 907 can include the same material, except that the source 907 can be treated to remove some of the sulfur and/or selenium.

In one embodiment, the transistor 900 can include a dielectric 908. In another embodiment, dielectric 908 can include an oxide. In another embodiment, the dielectric 908 can include an interlayer dielectric (ILD) material. In another embodiment, ILD can include silicon dioxide (SiO$_2$), or a low-K material. In one embodiment, the dielectric 908 can be deposited using PVD, CVD, MOCVD, and/or ALD, and the like.

In one embodiment, the transistor 900 can include an angular region 909 in the source 906 and/or the drain 907. In one embodiment, the angular region 909 can be generated by the removal of a portion of the source 906 and/or the drain 907, which can be performed using an etching process. In one embodiment, the etching process can include, for example, a dry etch. In one embodiment, the dry etch can include, for example, a plasma-based and/or a mechanical-based etch. In one embodiment, the etching process can include, for example, a wet etch. The wet etching process can include, for example, any suitable chemicals for the removal of the portion of the source 906 and/or the drain 907.

In one embodiment, the transistor can include a channel 910. In another embodiment, the channel 910 can include an Indian Gallium Arsenide material. In one embodiment, the channel 910 can include silicon. In another embodiment, the channel 910 can include intrinsic silicon. In one embodiment, the channel 910 can be deposited using MBE. In another embodiment, the channel 910 can include black phosphorous, amorphous silicon, germanium, carbon nanotube, and the like. In one embodiment, the channel 910 can include silicon, germanium, silicon germanium (SiGe), indium phosphide (InP), indium arsenide (InAs), indium gallium arsenide (InGaAs), gallium nitride (GaN), amorphous semiconductors such as zinc oxide (ZnO), indium gallium zinc oxide (IGZO), amorphous silicon (a-Si), amorphous germanium (a-Ge), polycrystalline germanium, polycrystalline silicon, and/or polycrystalline InGaAs, and the like. In one embodiment, the channel width can depend on the technology used to generate the transistor. In another embodiment, the channel 910 can be approximately 0.5 nm to approximately 200 nm long (in the y-dimension), with example thicknesses of approximately 60 nm to approximately 80 nm long (in the y-dimension). In one embodiment, the channel width can be approximately 200 nm down to approximately 5 nm (in the x-dimension). In one embodiment, the channel 910 can be deposited using PVD, CVD, MOCVD, MBE, and/or ALD, and the like.

In an embodiment, the transistor 900 can include a dummy gate 912. In another embodiment, the dummy gate 912 can include a polysilicon material. In another embodiment, dummy gate 912 can include an oxide. In another embodiment, the dummy gate 912 can include an interlayer dielectric (ILD) material. In another embodiment, ILD can include silicon dioxide ($SiO_2$), or a low-K material. In one embodiment, the dummy gate 912 can be deposited using PVD, CVD, MOCVD, and/or ALD, and the like. In one embodiment, the dummy gate 912 can serve as a placeholder for the deposition (at a later step) of a gate and a gate material, to be discussed below.

Figure 10:
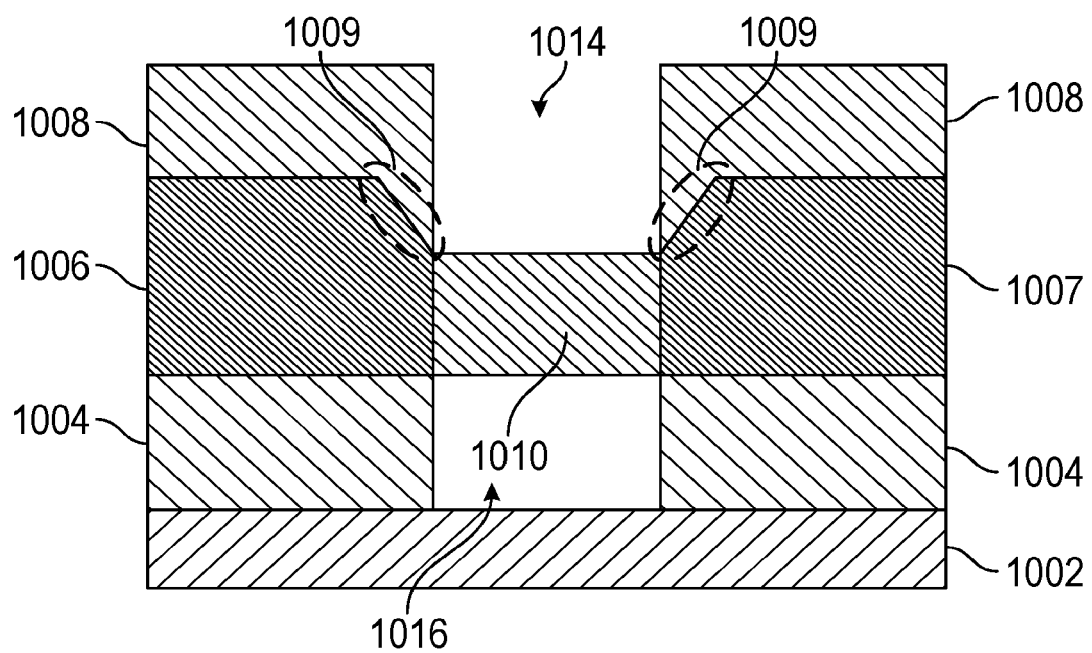
FIG. 10 shows a diagram of another partial structure of a transistor for the fabrication of a non-vertical gate, in accordance with one or more example embodiments of the disclosure.

FIG. 10 shows a diagram of a partial structure of a transistor 1000 for the fabrication of a non-vertical gate, in accordance with one or more example embodiments of the disclosure. In one embodiment, the transistor 1000 can include a first recess 1014 for the deposition of a top gate in a future step. In another embodiment, the transistor 1000 can include a second recess 1016 for the deposition of a bottom gate. In one embodiment, the first recess 1014 can be generated by the removal of the portion of the dummy gate 912. In one embodiment, the second recess 1016 can be generated by the removal of a portion of the buffer layer 904. In one embodiment, the removal of the portion of the dummy gate 912 or the buffer layer 904 can be performed using an etching process. In one embodiment, the etching process can include, for example, a dry etch. In one embodiment, the dry etch can include, for example, a plasma-based and/or a mechanical-based etch. In one embodiment, the etching process can include, for example, a wet etch. The wet etching process can include, for example, any suitable chemicals for the removal of the dummy gate 912 or the buffer layer 904.

In one embodiment, the transistor 1000 can include a substrate 1002. In one embodiment, the substrate 1002 can refer to a solid (usually planar) substance onto which a layer of another substance is applied, and to which that second substance adheres. In another embodiment, the substrate 1002 can include a silicon substrate. In one embodiment, the substrate 1002 can include a p-doped silicon substrate. In one embodiment, the substrate 1002 can be a thin slice of material such as silicon, silicon oxide, silicon dioxide, aluminum oxide, sapphire, an alloy of silicon and germanium, and/or indium phosphide (InP), and the like. In one embodiment, the substrate 1002 can include a semiconductor material (e.g., monocrystalline silicon, germanium, silicon germanium, SiGe, and/or a III-V materials based material (e.g., gallium arsenide, GaAs), or any combination thereof).

In another embodiment, the transistor 1000 can include a buffer 1004. In one embodiment, the buffer layer 1004 can include any material suitable to insulate adjacent devices and prevent current leakage. In one embodiment, the buffer layer 1004 can include a shallow trench isolation (STI) layer. In one embodiment, the STI layer can provide field isolation regions that isolate one fin from other fins (not shown), for example, other fins on adjacent device. In one embodiment, the buffer layer 1004 can include an oxide layer (e.g., silicon dioxide), or any other electrically insulating layer. In one embodiment, the buffer layer 1004 can include an interlayer dielectric (ILD), such as silicon dioxide. In one embodiment, the buffer layer 1004 may include polyimide, epoxy, photodefinable materials (for example, benzocyclobutene (BCB)), WPR-series materials, and/or spin-on-glass. In one embodiment, the buffer layer 1004 can include a low permittivity (low-k) ILD layer. In one embodiment, low-k can refer to dielectrics having a dielectric constant (permittivity k) lower than the permittivity of silicon dioxide. In one embodiment, the thickness of the buffer layer 1004 can be approximately 10 nm to approximately 200 nm, with an example thicknesses of approximately 50 nm to approximately 100 nm. In one embodiment, the buffer layer 1004 can be deposited using PVD, CVD and/or ALD, and the like.

In one embodiment, the transistor 1000 can include a source 1006. In another embodiment, the source 1006 can include an N doped Indian Gallium Arsenide material. In one embodiment, the source 1006 can include silicon. In another embodiment, the silicon material may be n-doped. In another embodiment, the source 1006 can be fabricated using MBE. In another embodiment, the source 1006 can include doped or undoped black phosphorous, titanium, tantalum, cobalt, molybdenum, titanium nitride, tantalum nitride, hafnium, copper, gadolinium, and the like. In one embodiment, the source 1006 can include silicon, germanium, silicon germanium (SiGe), indium phosphide (InP), indium arsenide (InAs), indium gallium arsenide (InGaAs), gallium nitride (GaN), amorphous semiconductors such as zinc oxide (ZnO), indium gallium zinc oxide (IGZO), amorphous silicon (a-Si), amorphous germanium (a-Ge), polycrystalline germanium, polycrystalline silicon, and/or polycrystalline InGaAs, and the like. In one embodiment, the doping can include generating electron vacancies in the source 1006. In one embodiment, source can include gettering materials. In one embodiment, the gettering materials can getter sulfur. In one embodiment, the source 1006 can be doped, for example, by creating vacancies of sulfur and selenium. In one embodiment, the source 1006 can be doped with oxygen vacancies if the source comprises an oxide or a multi-material system. In another embodiment, the source can be doped with phosphorous, boron, aluminum, tin, hafnium, titanium, copper, indium, and/or arsenic if the source 1006 comprises a non-oxide a single-material semiconductor. In another embodiment, the source 1006 can be approximately 1 nanometer to approximately 75 nm thick (y dimension), with example thicknesses of approximately 20 nm to approximately 30 nm thick (y dimension). In one embodiment, the source 1006 can be deposited using PVD, CVD, MOCVD, MBE, and/or ALD, and the like.

In one embodiment, the transistor 1000 can include a drain 1007. In another embodiment, the drain 1007 can include an N doped Indian Gallium Arsenide layer material. In one embodiment, the drain 1007 can include silicon. In another embodiment, the silicon material may be n-doped. In another embodiment, the drain 1007 can be fabricated using MBE. In another embodiment, the drain 1007 can include can include doped or undoped black phosphorous, titanium, tantalum, cobalt, molybdenum, titanium nitride, tantalum nitride, hafnium, copper, gadolinium, and the like. In one embodiment, the doping can include generating electron vacancies in the drain 1007. In one embodiment, the drain 1007 can include silicon, germanium, silicon germanium (SiGe), indium phosphide (InP), indium arsenide (InAs), indium gallium arsenide (InGaAs), gallium nitride (GaN), amorphous semiconductors such as zinc oxide (ZnO), indium gallium zinc oxide (IGZO), amorphous silicon (a-Si), amorphous germanium (a-Ge), polycrystalline germanium, polycrystalline silicon, and/or polycrystalline InGaAs, and the like. In one embodiment, the drain 1007 can include gettering materials. In one embodiment, the gettering materials can getter sulfur. In one embodiment, the drain can be doped with oxygen vacancies if the source comprises an oxide or a multi-material system. In another embodiment, the source 1006 can be doped with phosphorous, boron, aluminum, tin, hafnium, titanium, copper, indium, and/or arsenic if the drain comprises a non-oxide a single-material semiconductor. In another embodiment, the drain 1007 can have a thickness of approximately 0.5 nm to approximately 100 nm (in the x or y dimensions), with example thicknesses of approximately 0.5 nm to approximately 20 nm (in the x or y dimensions). In one embodiment, the drain 1007 can be deposited using PVD, CVD, MOCVD, MBE, and/or ALD, and the like. In one embodiment, the source 1006 and drain 1007 can include the same material, except that the source 1006 can be treated to remove some of the sulfur and/or selenium.

In one embodiment, the transistor 1000 can include a dielectric 1008. In another embodiment, dielectric 1008 can include an oxide. In another embodiment, the dielectric 1008 can include an interlayer dielectric (ILD) material. In another embodiment, ILD can include silicon dioxide (SiO$_2$), or a low-K material. In one embodiment, the dielectric 1008 can be deposited using PVD, CVD, MOCVD, and/or ALD, and the like.

In one embodiment, the transistor 1000 can include an angular region 1009 in the source 1006 and/or the drain 1007. In one embodiment, the angular region 1009 can be generated by the removal of a portion of the source 1006 and/or the drain 1007, which can be performed using an etching process. In one embodiment, the etching process can include, for example, a dry etch. In one embodiment, the dry etch can include, for example, a plasma-based and/or a mechanical-based etch. In one embodiment, the etching process can include, for example, a wet etch. The wet etching process can include, for example, any suitable chemicals for the removal of the portion of the source 1006 and/or the drain 1007.

In one embodiment, the transistor can include a channel 1010. In another embodiment, the channel 1010 can include an Indian Gallium Arsenide material. In another embodiment, the channel 1010 can include silicon. In another embodiment, the channel 1010 can include intrinsic silicon. In one embodiment, the channel 1010 can be deposited using MBE. In another embodiment, the channel 1010 can include black phosphorous, amorphous silicon, germanium, carbon nanotube, and the like. In one embodiment, the channel 1010 can include silicon, germanium, indium gallium arsenide (InGaAs), gallium nitride (GaN), amorphous semiconductors such as zinc oxide (ZnO), indium gallium zinc oxide (IGZO), amorphous silicon (a-Si), amorphous germanium (a-Ge), polycrystalline germanium, polycrystalline silicon, and/or polycrystalline InGaAs, and the like. In one embodiment, the channel width can depend on the technology used to generate the transistor. In another embodiment, the channel 1010 can be approximately 0.5 nm to approximately 200 nm long (in the y-dimension), with example thicknesses of approximately 60 nm to approximately 80 nm long (in the y-dimension). In one embodiment, the channel width can be approximately 200 nm down to approximately 5 nm (in the x-dimension). In one embodiment, the channel 1010 can be deposited using PVD, CVD, MOCVD, MBE, and/or ALD, and the like.

Figure 11:
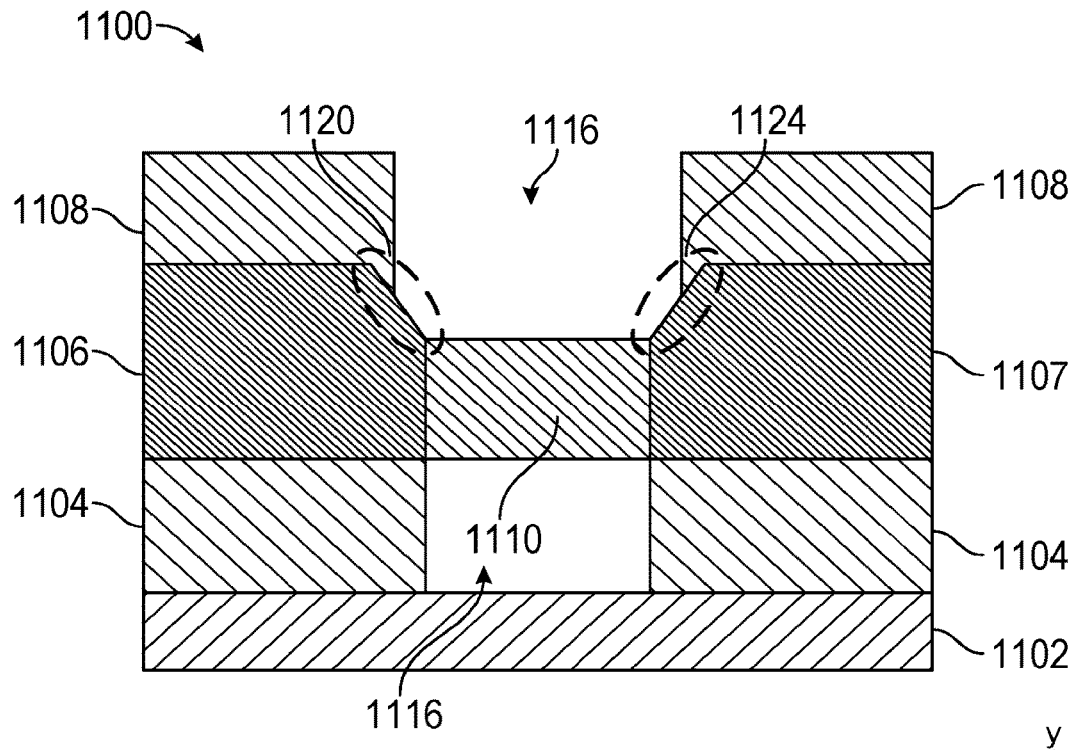
FIG. 11 shows a diagram of another partial structure of a transistor for the fabrication of a non-vertical gate, in accordance with one or more example embodiments of the disclosure.

FIG. 11 shows a diagram of a partial structure of a transistor 1100 for the fabrication of a non-vertical gate, in accordance with one or more example embodiments of the disclosure. In one embodiment, the transistor 1100 can include a recess 1116 for the top gate that can be similar to the recess 1114 except that it is expanded to expose a portion of the source 1120 and a portion of the drain 1124 that can include a crystallographic facet of the source 1106 and/or the drain 1107.

In one embodiment, the recess 1116 can be generated by the removal of the portion of the recess 1014. In one embodiment, the removal of the portion of the portion of the recess 1014 can be performed using an etching process. In one embodiment, the etching process can include, for example, a dry etch. In one embodiment, the dry etch can include, for example, a plasma-based and/or a mechanical-based etch. In one embodiment, the etching process can include, for example, a wet etch. The wet etching process can include, for example, any suitable chemicals for the removal of the portion of the recess 1014.

In one embodiment, the transistor 1100 can include a substrate 1102. In one embodiment, the substrate 1102 can refer to a solid (usually planar) substance onto which a layer of another substance is applied, and to which that second substance adheres. In another embodiment, the substrate 1102 can include a silicon substrate. In one embodiment, the substrate 1102 can include a p-doped silicon substrate. In one embodiment, the substrate 1102 can be a thin slice of material such as silicon, silicon oxide, silicon dioxide, aluminum oxide, sapphire, an alloy of silicon and germanium, and/or indium phosphide (InP), and the like. In one embodiment, the substrate 1102 can include a semiconductor material (e.g., monocrystalline silicon, germanium, silicon germanium, SiGe, and/or a III-V materials based material (e.g., gallium arsenide, GaAs), or any combination thereof).

In another embodiment, the transistor 1100 can include a buffer 1104. In one embodiment, the buffer layer 1104 can include any material suitable to insulate adjacent devices and prevent current leakage. In one embodiment, the buffer layer 1104 can include a shallow trench isolation (STI) layer. In one embodiment, the STI layer can provide field isolation regions that isolate one fin from other fins (not shown), for example, other fins on adjacent device. In one embodiment, the buffer layer 1104 can include an oxide layer (e.g., silicon dioxide), or any other electrically insulating layer. In one embodiment, the buffer layer 1104 can include an interlayer dielectric (ILD), such as silicon dioxide. In one embodiment, the buffer layer 1104 may include polyimide, epoxy, photodefinable materials (for example, benzocyclobutene (BCB)), WPR-series materials, and/or spin-on-glass. In one embodiment, the buffer layer 104 can include a low permittivity (low-k) ILD layer. In one embodiment, low-k can refer to dielectrics having a dielectric constant (permittivity k) lower than the permittivity of silicon dioxide. In one embodiment, the thickness of the buffer layer 1104 can be approximately 10 nm to approximately 200 nm, with an example thicknesses of approximately 50 nm to approximately 100 nm. In one embodiment, the buffer layer 1104 can be deposited using PVD, CVD and/or ALD, and the like.

In one embodiment, the transistor 1100 can include a source 1106. In another embodiment, the source 1106 can include an N doped Indian Gallium Arsenide material. In one embodiment, the source 1106 can include silicon. In another embodiment, the silicon material may be n-doped. In another embodiment, the source 1106 can be fabricated using MBE. In another embodiment, the source 1106 can include doped or undoped black phosphorous, titanium, tantalum, cobalt, molybdenum, titanium nitride, tantalum nitride, hafnium, copper, gadolinium, and the like. In one embodiment, the source 1106 can include silicon, germanium, silicon germanium (SiGe), indium phosphide (InP), indium arsenide (InAs), indium gallium arsenide (InGaAs), gallium nitride (GaN), amorphous semiconductors such as zinc oxide (ZnO), indium gallium zinc oxide (IGZO), amorphous silicon (a-Si), amorphous germanium (a-Ge), polycrystalline germanium, polycrystalline silicon, and/or polycrystalline InGaAs, and the like. In one embodiment, the doping can include generating electron vacancies in the source 1106. In one embodiment, source 1106 can include gettering materials. In one embodiment, the gettering materials can getter sulfur. In one embodiment, the source 1106 can be doped, for example, by creating vacancies of sulfur and selenium. In one embodiment, the source 1106 can be doped with oxygen vacancies if the source 1106 comprises an oxide or a multi-material system. In another embodiment, the source 1106 can be doped with phosphorous, boron, aluminum, tin, hafnium, titanium, copper, indium, and/or arsenic if the source 1106 comprises a non-oxide a single-material semiconductor. In another embodiment, the source 1106 can be approximately 1 nanometer to approximately 75 nm thick (y dimension), with example thicknesses of approximately 20 nm to approximately 30 nm thick (y dimension). In one embodiment, the source 1106 can be deposited using PVD, CVD, MOCVD, MBE, and/or ALD, and the like.

In one embodiment, the transistor 1100 can include a drain 1107. In another embodiment, the drain 1107 can include an N doped Indian Gallium Arsenide layer material. In one embodiment, the drain 1107 can include silicon. In another embodiment, the silicon material may be n-doped. In another embodiment, the drain 1107 can be fabricated using MBE. In another embodiment, the drain 1107 can include can include doped or undoped black phosphorous, titanium, tantalum, cobalt, molybdenum, titanium nitride, tantalum nitride, hafnium, copper, gadolinium, and the like. In one embodiment, the doping can include generating electron vacancies in the drain 1107. In one embodiment, the drain 1107 can include silicon, germanium, silicon germanium (SiGe), indium phosphide (InP), indium arsenide (InAs), indium gallium arsenide (InGaAs), gallium nitride (GaN), amorphous semiconductors such as zinc oxide (ZnO), indium gallium zinc oxide (IGZO), amorphous silicon (a-Si), amorphous germanium (a-Ge), polycrystalline germanium, polycrystalline silicon, and/or polycrystalline InGaAs, and the like. In one embodiment, the drain 1107 can include gettering materials. In one embodiment, the gettering materials can getter sulfur. In one embodiment, the drain 1107 can be doped with oxygen vacancies if the source 1106 comprises an oxide or a multi-material system. In another embodiment, the source 1106 can be doped with phosphorous, boron, aluminum, tin, hafnium, titanium, copper, indium, and/or arsenic if the drain comprises a non-oxide a single-material semiconductor. In one embodiment, the drain 1107 can have a thickness of approximately 0.5 nm to approximately 100 nm (in the x or y dimensions), with example thicknesses of approximately 0.5 nm to approximately 20 nm (in the x or y dimensions). In one embodiment, the drain 1107 can be deposited using PVD, CVD, MOCVD, MBE, and/or ALD, and the like. In one embodiment, the source 1106 and drain 1107 can include the same material, except that the source 1106 can be treated to remove some of the sulfur and/or selenium.

In one embodiment, the transistor 1100 can include a dielectric 1108. In another embodiment, dielectric 1108 can include an oxide. In another embodiment, the dielectric 1108 can include an interlayer dielectric (ILD) material. In another embodiment, ILD can include silicon dioxide (SiO$_2$), or a low-K material. In one embodiment, the dielectric 1108 can be deposited using PVD, CVD, MOCVD, and/or ALD, and the like.

In one embodiment, the transistor 1100 can include an angular region 1120 and/or an angular region 1124 in the source 1106 and/or the drain 1107. In one embodiment, the angular region 1120 can be generated by the removal of a portion of the source 1106 and/or the drain 1107, which can be performed using an etching process. In one embodiment, the etching process can include, for example, a dry etch. In one embodiment, the dry etch can include, for example, a plasma-based and/or a mechanical-based etch. In one embodiment, the etching process can include, for example, a wet etch. The wet etching process can include, for example, any suitable chemicals for the removal of the portion of the source 1106 and/or the drain 1107.

In one embodiment, the transistor 1100 can include a channel 1110. In another embodiment, the channel 1110 can include an Indian Gallium Arsenide material. In one embodiment, the channel 1106 can include silicon. In another embodiment, the channel 1106 can include intrinsic silicon. In one embodiment, the channel 1106 can be deposited using MBE. In another embodiment, the channel 1106 can include black phosphorous, amorphous silicon, germanium, carbon nanotube, and the like. In one embodiment, the channel 1106 can include silicon, germanium, silicon germanium (SiGe), indium phosphide (InP), indium arsenide (InAs), indium gallium arsenide (InGaAs), gallium nitride (GaN), amorphous semiconductors such as zinc oxide (ZnO), indium gallium zinc oxide (IGZO), amorphous silicon (a-Si), amorphous germanium (a-Ge), polycrystalline germanium, polycrystalline silicon, and/or polycrystalline InGaAs, and the like. In one embodiment, the channel width can depend on the technology used to generate the transistor. In another embodiment, the channel 1106 can be approximately 0.5 nm to approximately 200 nm long (in the y-dimension), with example thicknesses of approximately 60 nm to approximately 80 nm long (in the y-dimension). In one embodiment, the channel width can be approximately 200 nm down to approximately 5 nm (in the x-dimension).

In one embodiment, the channel 1106 can be deposited using PVD, CVD, MOCVD, MBE, and/or ALD, and the like.

FIG. 12 shows a diagram of a partial structure of a transistor 1200 for the fabrication of a non-vertical gate, in accordance with one or more example embodiments of the disclosure. In one embodiment, the diagram 1200 can include a top gate 1228. In another embodiment, the top gate 1228 can include a metal. In another embodiment, the top gate 1228 can include a transition metal. In one embodiment, the top gate 1228 can be used to tune the threshold voltage of the device. In one embodiment, top gate 1228 can include titanium nitride, cobalt, tungsten and/or platinum. In one embodiment, the top gate 1228 can be deposited using PVD, CVD, MOCVD, MBE and/or ALD, and the like. In one embodiment, the top gate 1228 can have a width of approximately 10 nm to approximately 150 nm (x-dimension). In another embodiment, the top gate 1228 can have a length of approximately 10 nm to approximately 150 nm (y-dimension).

In one embodiment, the transistor 1200 can include a gate material 1226 for the top gate 1228, for example, proximate to the source 1206 and/or drain 1207. In one embodiment, the gate material 1226 can include a high-K dielectric material. In another embodiment, the high-K material, for example, hafnium oxide, tantalum oxide, titanium oxide, aluminum oxide, silicon dioxide, silicon nitride and the like. In another embodiment, the gate material 1226 can include silicon oxide, which may not be a high-K material. In one embodiment, an electroglass (EG) can be used as the gate material 1226. In one embodiment, the gate material 1226 can include hydrogenated boron nitride (HBN). In one embodiment, the gate material can be deposited using PVD, CVD, MOCVD, MBE, and/or ALD, and the like. In one embodiment, the gate material 1226 can have a width of 0.5 nm to approximately 20 nm (x-dimension). In another embodiment, the gate material 1226 can have a thickness of approximately 0.5 nm to approximately 100 nm (in the y dimension).

In another embodiment, the transistor 1200 can include a bottom gate 1232, for example, proximate to the source 1206 and/or drain 1207. In another embodiment, the bottom gate 1232 can include a metal. In another embodiment, the bottom gate 1232 can include a transition metal. In one embodiment, the bottom gate 1232 can be used to tune the threshold voltage of the device. In one embodiment, bottom gate 1232 can include titanium nitride, cobalt, tungsten and/or platinum. In one embodiment, the bottom gate 1232 can be deposited using PVD, CVD, MOCVD, MBE and/or ALD, and the like. In one embodiment, the bottom gate 1232 can have a width of approximately 10 nm to approximately 150 nm (x-dimension). In another embodiment, the bottom gate 1232 can have a length of approximately 10 nm to approximately 150 nm (y-dimension).

In one embodiment, the transistor 1200 can include a gate material 1230 for the bottom gate 1232, for example, proximate to the buffer layer 1204, and/or source 1206 and/or drain 1207. In one embodiment, the gate material 1230 can include a high-K dielectric material. In another embodiment, the high-K material, for example, hafnium oxide, tantalum oxide, titanium oxide, aluminum oxide, silicon dioxide, silicon nitride and the like. In another embodiment, the gate material 1230 can include silicon oxide, which may not be a high-K material. In one embodiment, an electroglass (EG) can be used as the gate material 1230. In one embodiment, the gate material 1230 can include hydrogenated boron nitride (HBN). In one embodiment, the gate material can be deposited using PVD, CVD, MOCVD, MBE, and/or ALD, and the like. In one embodiment, the gate material 1230 can have a width of 0.5 nm to approximately 20 nm (x-dimension). In another embodiment, the gate material 1230 can have a thickness of approximately 0.5 nm to approximately 100 nm (in the y dimension).

In one embodiment, the transistor 1200 can include a substrate 1202. In one embodiment, the substrate 1202 can refer to a solid (usually planar) substance onto which a layer of another substance is applied, and to which that second substance adheres. In another embodiment, the substrate 1202 can include a silicon substrate. In one embodiment, the substrate 1202 can include a p-doped silicon substrate. In one embodiment, the substrate 1202 can be a thin slice of material such as silicon, silicon oxide, silicon dioxide, aluminum oxide, sapphire, an alloy of silicon and germanium, and/or indium phosphide (InP), and the like. In one embodiment, the substrate 1202 can include a semiconductor material (e.g., monocrystalline silicon, germanium, silicon germanium, SiGe, and/or a III-V materials based material (e.g., gallium arsenide, GaAs), or any combination thereof).

In another embodiment, the transistor 1200 can include a buffer 1204, for example, proximate to the buffer 1204. In one embodiment, the buffer layer 1204 can include any material suitable to insulate adjacent devices and prevent current leakage. In one embodiment, the buffer layer 1204 can include a shallow trench isolation (STI) layer. In one embodiment, the STI layer can provide field isolation regions that isolate one fin from other fins (not shown), for example, other fins on adjacent device. In one embodiment, the buffer layer 1204 can include an oxide layer (e.g., silicon dioxide), or any other electrically insulating layer. In one embodiment, the buffer layer 1204 can include an interlayer dielectric (ILD), such as silicon dioxide. In one embodiment, the buffer layer 1204 may include polyimide, epoxy, photodefinable materials (for example, benzocyclobutene (BCB)), WPR-series materials, and/or spin-on-glass. In one embodiment, the buffer layer 1204 can include a low permittivity (low-k) ILD layer. In one embodiment, low-k can refer to dielectrics having a dielectric constant (permittivity k) lower than the permittivity of silicon dioxide.

In one embodiment, the thickness of the buffer layer 1204 can be approximately 10 nm to approximately 200 nm, with an example thicknesses of approximately 50 nm to approximately 100 nm. In one embodiment, the buffer layer 1204 can be deposited using PVD, CVD and/or ALD, and the like.

In one embodiment, the transistor 1200 can include a source 1206, for example, proximate to the buffer layer 1204. In another embodiment, the source 1206 can include an N doped Indian Gallium Arsenide material. In one embodiment, the source 1206 can include silicon. In another embodiment, the silicon material may be n-doped. In another embodiment, the source 1206 can be fabricated using MBE. In another embodiment, the source 1206 can include doped or undoped black phosphorous, titanium, tantalum, cobalt, molybdenum, titanium nitride, tantalum nitride, hafnium, copper, gadolinium, and the like. In one embodiment, the source 1204 can include silicon, germanium, silicon germanium (SiGe), indium phosphide (InP), indium arsenide (InAs), indium gallium arsenide (InGaAs), gallium nitride (GaN), amorphous semiconductors such as zinc oxide (ZnO), indium gallium zinc oxide (IGZO), amorphous silicon (a-Si), amorphous germanium (a-Ge), polycrystalline germanium, polycrystalline silicon, and/or polycrystalline InGaAs, and the like. In one embodiment, the doping can include generating electron vacancies in the source 1206. In one embodiment, source can include gettering materials. In one embodiment, the gettering materials can getter sulfur. In one embodiment, the source 1206 can be doped, for example, by creating vacancies of sulfur and selenium. In one embodiment, the source 1206 can be doped with oxygen vacancies if the source comprises an oxide or a multi-material system. In another embodiment, the source can be doped with phosphorous, boron, aluminum, tin, hafnium, titanium, copper, indium, and/or arsenic if the source 1206 comprises a non-oxide a single-material semiconductor. In another embodiment, the source 1206 can be approximately 1 nanometer to approximately 75 nm thick (y dimension), with example thicknesses of approximately 20 nm to approximately 30 nm thick (y dimension). In one embodiment, the source 1206 can be deposited using PVD, CVD, MOCVD, MBE, and/or ALD, and the like.

In one embodiment, the transistor 1200 can include a drain 1207, proximate to the buffer layer 1204. In another embodiment, the drain 1207 can include an N doped Indian Gallium Arsenide layer material. In one embodiment, the device 1200 can include a drain 1207. In one embodiment, the drain 1207 can be deposited using a mask. In one embodiment, the drain 1207 can include silicon. In another embodiment, the silicon material may be n-doped. In another embodiment, the drain 1207 can be fabricated using MBE. In another embodiment, the drain 1207 can include can include doped or undoped black phosphorous, titanium, tantalum, cobalt, molybdenum, titanium nitride, tantalum nitride, hafnium, copper, gadolinium, and the like. In one embodiment, the doping can include generating electron vacancies in the drain 1207. In one embodiment, the drain 1207 can include silicon, germanium, silicon germanium (SiGe), indium phosphide (InP), indium arsenide (InAs), indium gallium arsenide (InGaAs), gallium nitride (GaN), amorphous semiconductors such as zinc oxide (ZnO), indium gallium zinc oxide (IGZO), amorphous silicon (a-Si), amorphous germanium (a-Ge), polycrystalline germanium, polycrystalline silicon, and/or polycrystalline InGaAs, and the like. In one embodiment, the drain can include gettering materials. In one embodiment, the gettering materials can getter sulfur. In one embodiment, the drain 1207 can be doped with oxygen vacancies if the source 1206 comprises an oxide or a multi-material system. In another embodiment, the source 1206 can be doped with phosphorous, boron, aluminum, tin, hafnium, titanium, copper, indium, and/or arsenic if the drain 1207 comprises a non-oxide a single-material semiconductor. In one embodiment, the drain 1207 can have a thickness of approximately 0.5 nm to approximately 100 nm (in the x or y dimensions), with example thicknesses of approximately 0.5 nm to approximately 20 nm (in the x or y dimensions). In one embodiment, the drain 1207 can be deposited using PVD, CVD, MOCVD, MBE, and/or ALD, and the like. In one embodiment, the source 1206 and drain 1207 can include the same material, except that the source 1206 can be treated to remove some of the sulfur and/or selenium.

In one embodiment, the transistor 1100 can include a dielectric 1208, proximate to the source 1206 and/or the drain 1207. In another embodiment, dielectric 1208 can include an oxide. In another embodiment, the dielectric 1208 can include an interlayer dielectric (ILD) material. In another embodiment, ILD can include silicon dioxide (SiO$_2$), or a low-K material. In one embodiment, the dielectric 1208 can be deposited using PVD, CVD, MOCVD, and/or ALD, and the like.

In one embodiment, the transistor 1200 can include an angular region 1220 and/or an angular region 1224 in the source 1206 and/or the drain 1207. In one embodiment, the angular region 1220 can be generated by the removal of a portion of the source 1206 and/or the drain 1207, which can be performed using an etching process. In one embodiment, the etching process can include, for example, a dry etch. In one embodiment, the dry etch can include, for example, a plasma-based and/or a mechanical-based etch. In one embodiment, the etching process can include, for example, a wet etch. The wet etching process can include, for example, any suitable chemicals for the removal of the portion of the source 1206 and/or the drain 1207.

In one embodiment, the transistor can include a channel 1210, for example, proximate to the source 1206 and/or the drain 1207. In another embodiment, the channel 1210 can include an Indian Gallium Arsenide material. In one embodiment, the device can further include a channel 1210. In one embodiment, the channel 1210 can include silicon. In another embodiment, the channel 1210 can include intrinsic silicon. In one 1210, the channel 1210 can be deposited using MBE. In another embodiment, the channel 1210 can include black phosphorous, amorphous silicon, germanium, carbon nanotube, and the like. In one embodiment, the channel 1210 can include silicon, germanium, silicon germanium (SiGe), indium phosphide (InP), indium arsenide (InAs), indium gallium arsenide (InGaAs), gallium nitride (GaN), amorphous semiconductors such as zinc oxide (ZnO), indium gallium zinc oxide (IGZO), amorphous silicon (a-Si), amorphous germanium (a-Ge), polycrystalline germanium, polycrystalline silicon, and/or polycrystalline InGaAs, and the like. In one embodiment, the channel width can depend on the technology used to generate the transistor. In another embodiment, the channel 1210 can be approximately 0.5 nm to approximately 200 nm long (in the y-dimension), with example thicknesses of approximately 60 nm to approximately 80 nm long (in the y-dimension). In one embodiment, the channel width can be approximately 200 nm down to approximately 5 nm (in the x-dimension). In one embodiment, the channel 1210 can be deposited using PVD, CVD, MOCVD, MBE, and/or ALD, and the like.

Figure 12A:
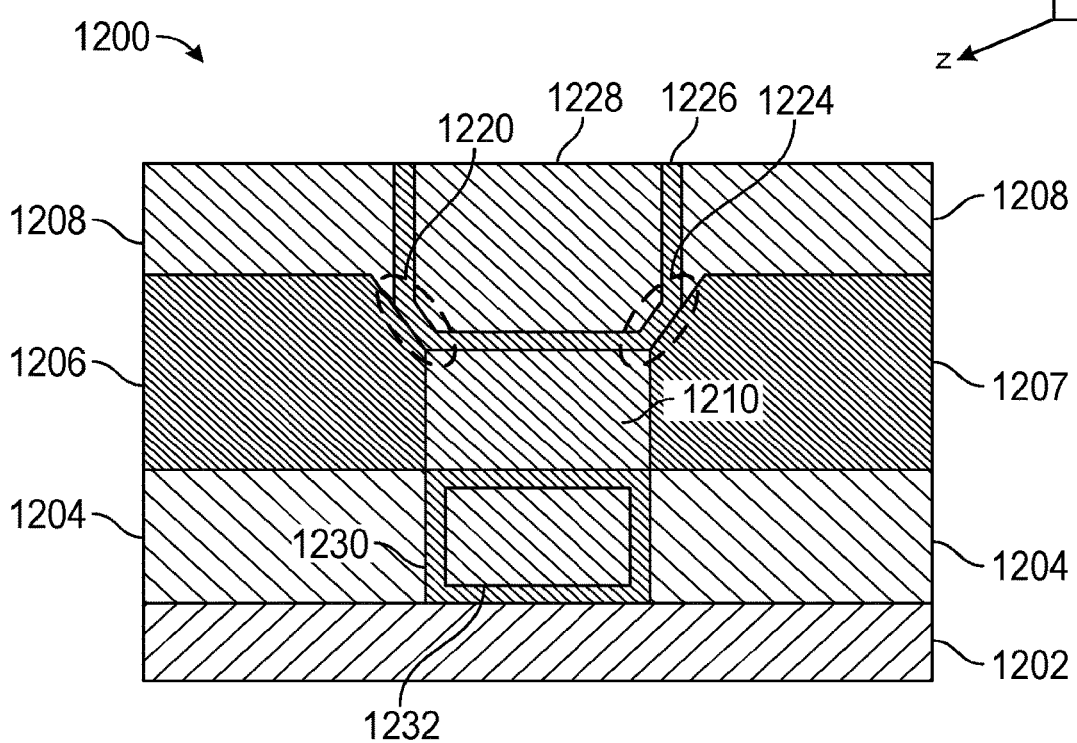
FIG. 12A shows a diagram of another partial structure of a transistor for the fabrication of a non-vertical gate, in accordance with one or more example embodiments of the disclosure.
Figure 12B:
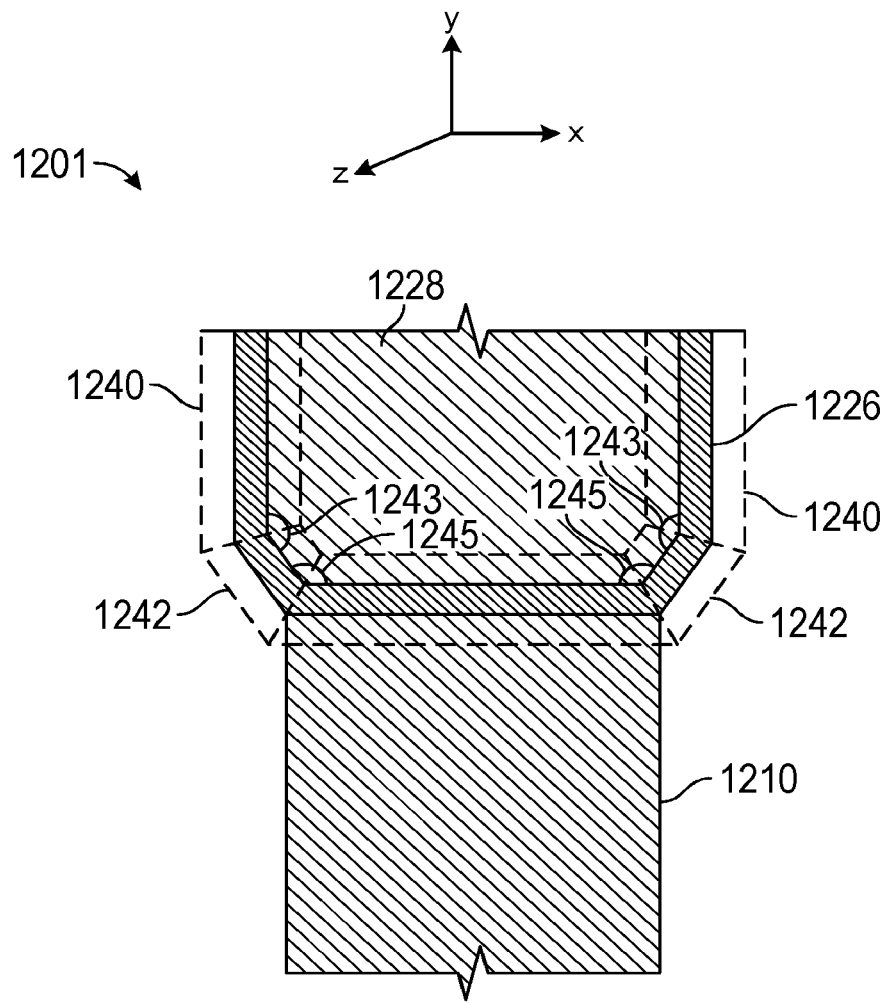
FIG. 12B shows a diagram of an enlarged portion of the transistor of FIG. 12A, in accordance with example embodiments of the disclosure.

FIG. 12B shows a diagram 1201 of an enlarged portion of the transistor of FIG. 12A, in accordance with example embodiments of the disclosure. In one embodiment, FIG. 12B shows a first portion 1240 of the gate 1228 and/or gate dielectric 1226, a connecting portion of the gate 1228 and/or gate dielectric 1226, and a second portion of the gate 1228 and/or gate dielectric 1226. In one embodiment, the first portion of the gate 1228 and/or gate dielectric 1226 can have at least a portion including one or more planar side walls. Similarly, in another embodiment, the second portion of the gate 1228 and/or gate dielectric 1226 can have at least a portion including one or more planar bottom walls. In one embodiment, the connecting portion 1242 can have more than one angle, for example, more than one obtuse angle. For example, although two angles 1243 and 1245 are shown in FIG. 12B, there can be three, four, or more angles having the same or different angle measurements. In one embodiment, the more than angle can have an angle of greater than about ninety degrees. In one embodiment, the connecting portion 1242 can be generated by an etching process, as described further herein.

Figure 13:
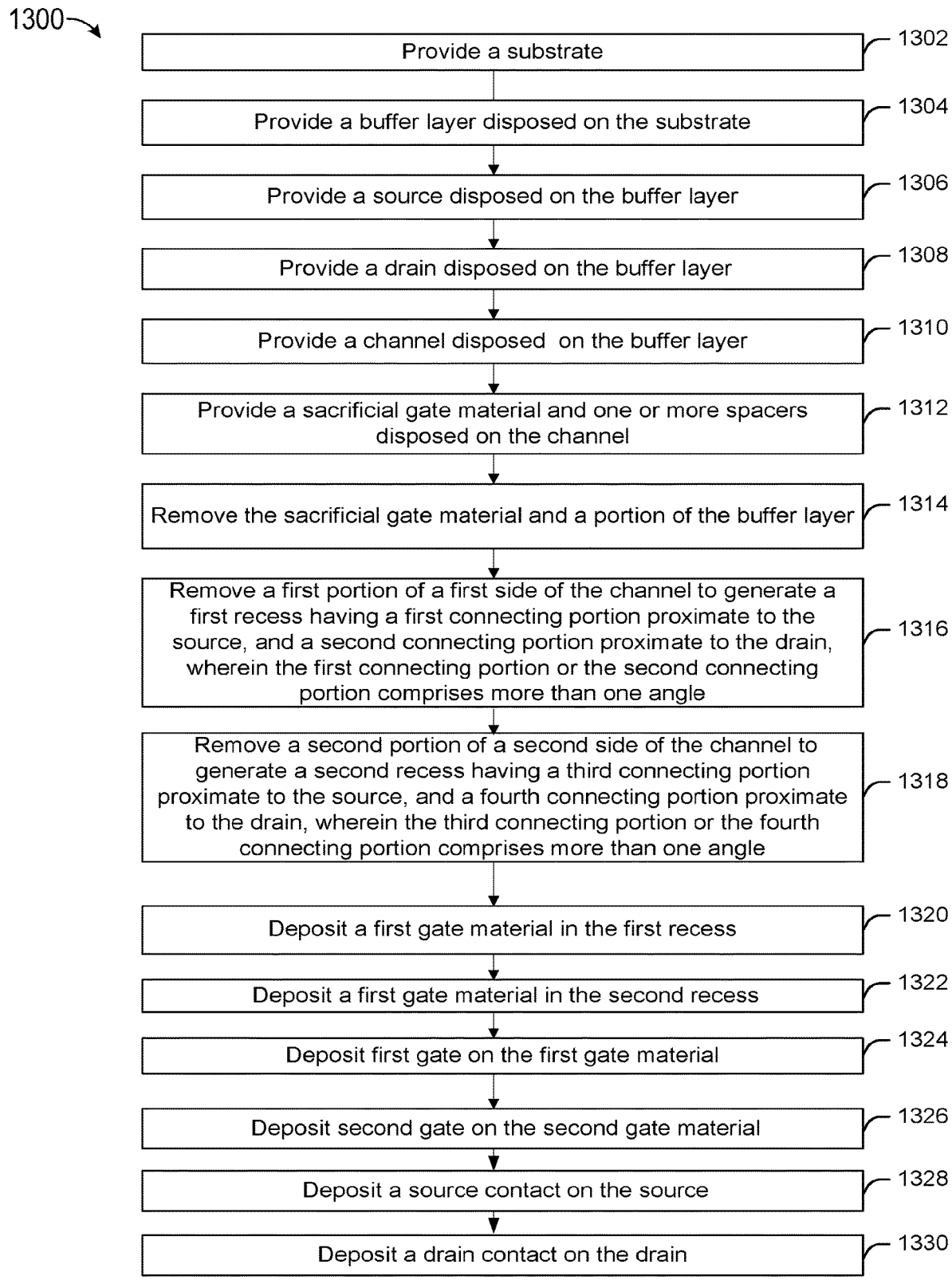
FIG. 13 shows a diagram of an example flowchart that describes the fabrication of transistor having a non-vertical gate, in accordance with example embodiments of the disclosure.

FIG. 13 shows a diagram of an example flowchart that describes the fabrication of transistor (for example, a MOSFET) having a non-vertical gate, in accordance with example embodiments of the disclosure. In block 1302, a substrate can be provided. In one embodiment, the substrate can refer to a solid (usually planar) substance onto which a layer of another substance is applied, and to which that second substance adheres. In another embodiment, the substrate can include a silicon substrate. In one embodiment, the substrate can include a p-doped silicon substrate. In one embodiment, the substrate can be a thin slice of material such as silicon, silicon oxide, silicon dioxide, aluminum oxide, sapphire, an alloy of silicon and germanium, and/or indium phosphide (InP), and the like. In one embodiment, the substrate can include a semiconductor material (e.g., monocrystalline silicon, germanium, silicon germanium, SiGe, and/or a III-V materials based material (e.g., gallium arsenide, GaAs), or any combination thereof).

In block 1304, a buffer layer can be provided on the substrate. In one embodiment, the buffer layer can include any material suitable to insulate adjacent devices and prevent current leakage. In one embodiment, the buffer layer can include a shallow trench isolation (STI) layer. In one embodiment, the STI layer can provide field isolation regions that isolate one fin from other fins (not shown), for example, other fins on adjacent device. In one embodiment, the buffer layer can include an oxide layer (e.g., silicon dioxide), or any other electrically insulating layer. In one embodiment, the buffer layer can include an interlayer dielectric (ILD), such as silicon dioxide. In one embodiment, the buffer layer may include polyimide, epoxy, photodefinable materials (for example, benzocyclobutene, BCB), WPR-series materials, and/or spin-on-glass. In one embodiment, the buffer layer can include a low permittivity (low-k) ILD layer. In one embodiment, low-k can refer to dielectrics having a dielectric constant (permittivity k) lower than the permittivity of silicon dioxide. In one embodiment, the thickness of the buffer layer can be approximately 10 nm to approximately 200 nm, with an example thicknesses of approximately 50 nm to approximately 100 nm. In one embodiment, the buffer layer can be deposited using PVD, CVD and/or ALD, and the like.

In block 1306, a source can be provided and be disposed on the buffer layer. In another embodiment, the source can include an n doped Indian Gallium Arsenide layer. In one embodiment, the source can include silicon. In another embodiment, the silicon material may be n-doped. In another embodiment, the source can be fabricated using MBE. In another embodiment, the source can include doped or undoped black phosphorous, titanium, tantalum, cobalt, molybdenum, titanium nitride, tantalum nitride, hafnium, copper, gadolinium, and the like. In one embodiment, the source can include silicon, germanium, silicon germanium (SiGe), indium phosphide (InP), indium arsenide (InAs), indium gallium arsenide (InGaAs), gallium nitride (GaN), amorphous semiconductors such as zinc oxide (ZnO), indium gallium zinc oxide (IGZO), amorphous silicon (a-Si), amorphous germanium (a-Ge), polycrystalline germanium, polycrystalline silicon, and/or polycrystalline InGaAs, and the like. In one embodiment, the doping can include generating electron vacancies in the source. In one embodiment, source can include gettering materials. In one embodiment, the gettering materials can getter sulfur. In one embodiment, the source can be doped, for example, by creating vacancies of sulfur and selenium. In one embodiment, the source can be doped with oxygen vacancies if the source comprises an oxide or a multi-material system. In another embodiment, the source can be doped with phosphorous, boron, aluminum, tin, hafnium, titanium, copper, indium, and/or arsenic if the source comprises a non-oxide a single-material semiconductor. In another embodiment, the source can be approximately 1 nanometer to approximately 75 nm thick (y dimension), with example thicknesses of approximately 20 nm to approximately 30 nm thick (y dimension). In one embodiment, the source can be deposited using PVD, CVD, MOCVD, MBE, and/or ALD, and the like.

In block 1308, a drain can be provided and be disposed on the buffer layer. In another embodiment, the drain can include an N doped Indian Gallium Arsenide material. In one embodiment, the drain can include silicon. In another embodiment, the silicon material may be n-doped. In another embodiment, the drain can be fabricated using MBE. In another embodiment, the drain can include can include doped or undoped black phosphorous, titanium, tantalum, cobalt, molybdenum, titanium nitride, tantalum nitride, hafnium, copper, gadolinium, and the like. In one embodiment, the doping can include generating electron vacancies in the drain. In one embodiment, the drain can include silicon, germanium, silicon germanium (SiGe), indium phosphide (InP), indium arsenide (InAs), indium gallium arsenide (InGaAs), gallium nitride (GaN), amorphous semiconductors such as zinc oxide (ZnO), indium gallium zinc oxide (IGZO), amorphous silicon (a-Si), amorphous germanium (a-Ge), polycrystalline germanium, polycrystalline silicon, and/or polycrystalline InGaAs, and the like. In one embodiment, the drain can include gettering materials. In one embodiment, the gettering materials can getter sulfur. In one embodiment, the drain can be doped with oxygen vacancies if the source comprises an oxide or a multi-material system. In another embodiment, the source can be doped with phosphorous, boron, aluminum, tin, hafnium, titanium, copper, indium, and/or arsenic if the drain comprises a non-oxide a single-material semiconductor. In one embodiment, the drain can have a thickness of approximately 0.5 nm to approximately 100 nm (in the x or y dimensions), with example thicknesses of approximately 0.5 nm to approximately 20 nm (in the x or y dimensions). In one embodiment, the can be deposited using PVD, CVD, MOCVD, MBE, and/or ALD, and the like. In one embodiment, the source and drain can include the same material, except that the source can be treated to remove some of the sulfur and/or selenium.

In block 1310, a channel can be provided and be disposed on the buffer layer. In another embodiment, the channel can include an Indian Gallium Arsenide material. In one embodiment, the device can further include a channel. In one embodiment, the channel can include silicon. In another embodiment, the channel can include intrinsic silicon. In one embodiment, the channel can be deposited using MBE. In another embodiment, the channel can include black phosphorous, amorphous silicon, germanium, carbon nanotube, and the like. In one embodiment, the channel can include silicon, germanium, silicon germanium (SiGe), indium phosphide (InP), indium arsenide (InAs), indium gallium arsenide (InGaAs), gallium nitride (GaN), amorphous semiconductors such as zinc oxide (ZnO), indium gallium zinc oxide (IGZO), amorphous silicon (a-Si), amorphous germanium (a-Ge), polycrystalline germanium, polycrystalline silicon, and/or polycrystalline InGaAs, and the like. In one embodiment, the channel width can depend on the technology used to generate the transistor. In another embodiment, the channel can be approximately 0.5 nm to approximately 200 nm long (in the y-dimension), with example thicknesses of approximately 60 nm to approximately 80 nm long (in the y-dimension). In one embodiment, the channel width can be approximately 200 nm down to approximately 5 nm (in the x-dimension). In one embodiment, the channel can be deposited using PVD, CVD, MOCVD, MBE, and/or ALD, and the like.

In block 1312, a sacrificial gate material and one or more spacers can be provided and be disposed on the channel. In one embodiment, the sacrificial gate material can also be reffered to as a dummy gate. In another embodiment, the dummy gate can include a polysilicon material. In one embodiment, the dummy gate can serve as a temporary placeholder for the eventual deposition of a gate and/or gate dielectric, to be further described below.

In another embodiment, spacer can include an oxide. In one embodiment, the oxide can include an interlayer dielectric (ILD) material. In another embodiment, ILD can include silicon dioxide (SiO2), or a low-K material. In one embodiment, the oxide can be deposited using PVD, CVD, MOCVD, and/or ALD, and the like.

In block 1314, the sacrificial gate material and a portion of the buffer layer can be removed. In one embodiment, a first recess can be generated by the removal of the portion of the dummy gate. In one embodiment, a second recess can be generated by the removal of a portion of the buffer layer. In one embodiment, the removal of the portion of the dummy gate or the buffer layer can be performed using an etching process. In one embodiment, the etching process can include, for example, a dry etch. In one embodiment, the dry etch can include, for example, a plasma-based and/or a mechanical-based etch. In one embodiment, the etching process can include, for example, a wet etch. The wet etching process can include, for example, any suitable chemicals for the removal of the dummy gate or the buffer layer.

In block 1316, a first portion of a first side of the channel can be removed to generate a first recess having a first corner proximate to the source, and a second corner proximate to the drain, wherein the first corner or the second corner has the interior angle greater than about ninety degrees. In one embodiment, the removal of the portion of the first portion of a first side of the channel can be performed using an etching process. In one embodiment, the etching process can include, for example, a dry etch. In one embodiment, the etching process can include, for example, a wet etch. The wet etching process can include, for example, any suitable chemicals for the removal of the first portion of a first side of the channel.

In block 1318, a second portion of a second side of the channel can be removed to generate a second recess having a third corner proximate to the source, and a fourth corner proximate to the drain, wherein the third corner or the fourth corner has the interior angle greater than about ninety degrees. In one embodiment, the removal of the second side of the channel can be performed using an etching process. In one embodiment, the etching process can include, for example, a dry etch. dummy gate. In one embodiment, the etching process can include, for example, a wet etch. The wet etching process can include, for example, any suitable chemicals for the removal of dummy gate.

In block 1320, a first gate material can be deposited in the first recess. In one embodiment, the gate material can include a high-K dielectric material. In another embodiment, the high-K material, for example, hafnium oxide, tantalum oxide, titanium oxide, aluminum oxide, silicon dioxide, silicon nitride and the like. In another embodiment, the gate material can include silicon oxide, which may not be a high-K material. In one embodiment, an electroglass (EG) can be used as the gate material. In one embodiment, the gate material can include hydrogenated boron nitride (HBN). In one embodiment, the gate material can be deposited using PVD, CVD, MOCVD, MBE, and/or ALD, and the like. In one embodiment, the gate material can have a width of 0.5 nm to approximately 20 nm (x-dimension). In another embodiment, the gate material can have a thickness of approximately 0.5 nm to approximately 100 nm (in they dimension).

In block 1322, a second gate material can be deposited in the second recess. In one embodiment, the gate material can include a high-K dielectric material. In another embodiment, the high-K material, for example, hafnium oxide, tantalum oxide, titanium oxide, aluminum oxide, silicon dioxide, silicon nitride and the like. In another embodiment, the gate material can include silicon oxide, which may not be a high-K material. In one embodiment, an electroglass (EG) can be used as the gate material. In one embodiment, the gate material can include hydrogenated boron nitride (HBN). In one embodiment, the gate material can be deposited using PVD, CVD, MOCVD, MBE, and/or ALD, and the like. In one embodiment, the gate material can have a width of 0.5 nm to approximately 20 nm (x-dimension). In another embodiment, the gate material can have a thickness of approximately 0.5 nm to approximately 100 nm (in the y dimension).

In block 1324, a first gate can be deposited on the first gate material. In another embodiment, the gate can include a metal. In another embodiment, the gate can include a transition metal. In one embodiment, the gate can be used to tune the threshold voltage of the device. In one embodiment, gate can include titanium nitride, cobalt, tungsten and/or platinum. In one embodiment, the gate can be deposited using PVD, CVD, MOCVD, MBE and/or ALD, and the like. In one embodiment, the gate can have a width of approximately 10 nm to approximately 150 nm (x-dimension). In another embodiment, the gate can have a length of approximately 10 nm to approximately 150 nm (y-dimension).

In block 1326, a second gate can be deposited on the second gate material. In another embodiment, the gate can include a metal. In another embodiment, the gate can include a transition metal. In one embodiment, the gate can be used to tune the threshold voltage of the device. In one embodiment, gate can include titanium nitride, cobalt, tungsten and/or platinum. In one embodiment, the gate can be deposited using PVD, CVD, MOCVD, MBE and/or ALD, and the like. In one embodiment, the gate can have a width of approximately 10 nm to approximately 150 nm (x-dimension). In another embodiment, the gate 214 can have a length of approximately 10 nm to approximately 150 nm (y-dimension).

In block 1328, a source contact can be deposited on the source. In one embodiment, the source contact can include a metal. In one embodiment, the metal can include gold, copper, silver, aluminum, zinc, tin, platinum, and any of the like. The source contact can include any alloys of such materials.

In block 1330, a drain contact can be deposited on the drain. In one embodiment, the drain contact can include a metal. In one embodiment, the metal can include gold, copper, silver, aluminum, zinc, tin, platinum, and any of the like. The drain contact can include any alloys of such materials.

Figure 14:
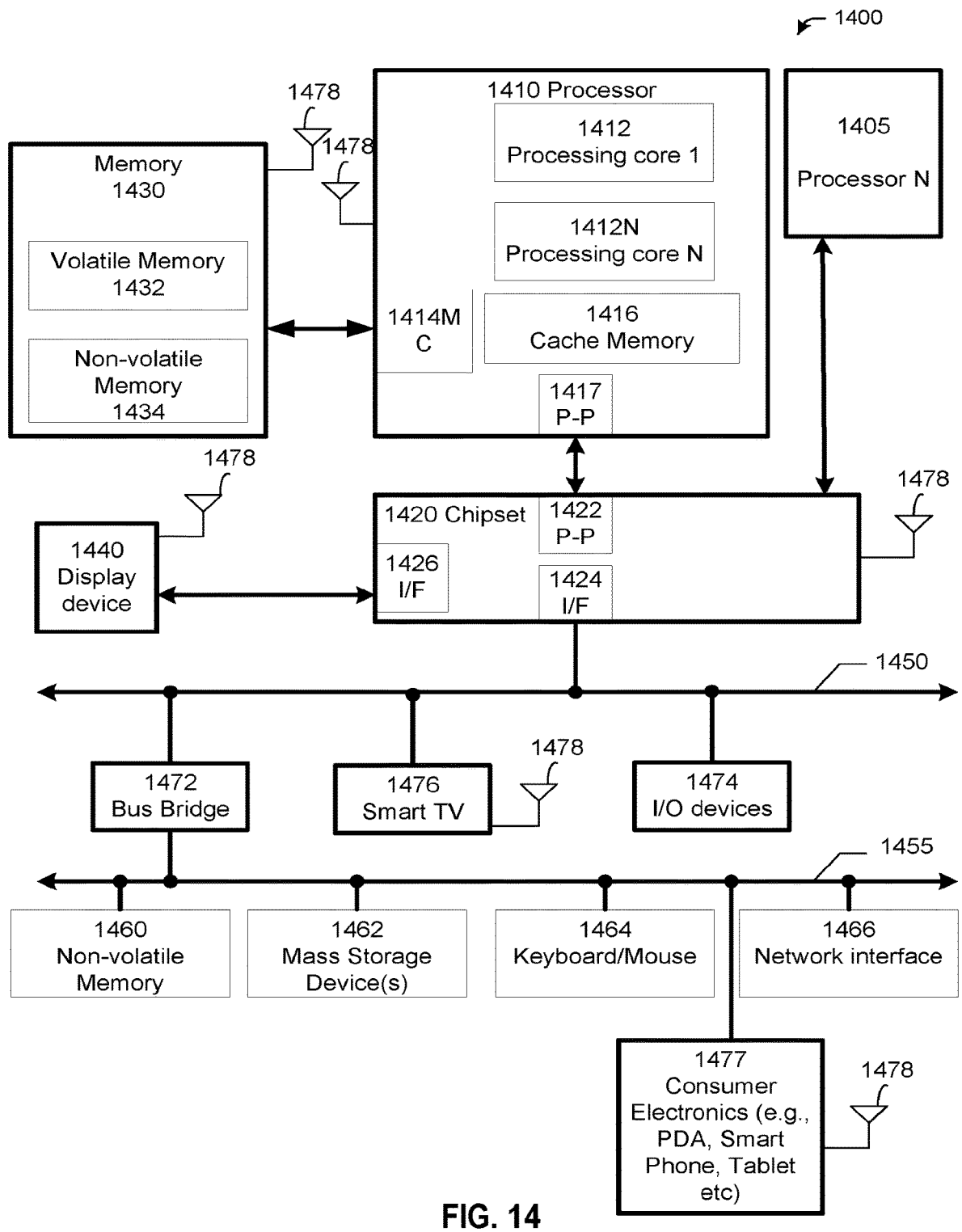
FIG. 14 shows a diagram of an example system, in accordance with example embodiments of the disclosure.

FIG. 14 depicts an example of a system 1400 according to one or more embodiments of the disclosure. In one embodiment, system 1400 includes, but is not limited to, a desktop computer, a laptop computer, a netbook, a tablet, a notebook computer, a personal digital assistant (PDA), a server, a workstation, a cellular telephone, a mobile computing device, a smart phone, an Internet appliance or any other type of computing device. In some embodiments, system 1400 can include a system on a chip (SOC) system.

In one embodiment, system 1400 includes multiple processors including processor 1410 and processor N 1405, where processor N 1405 has logic similar or identical to the logic of processor 1410. In one embodiment, processor 1410 has one or more processing cores (represented here by processing core 1 1412 and processing core N 1412N, where 1412N represents the Nth processor core inside processor 1410, where N is a positive integer). More processing cores can be present (but not depicted in the diagram of FIG. 14). In some embodiments, processing core 1412 includes, but is not limited to, pre-fetch logic to fetch instructions, decode logic to decode the instructions, execution logic to execute instructions, a combination thereof, or the like. In some embodiments, processor 1410 has a cache memory 1416 to cache instructions and/or data for system 1400. Cache memory 1416 may be organized into a hierarchical structure including one or more levels of cache memory.

In some embodiments, processor 1410 includes a memory controller (MC) 1414, which is configured to perform functions that enable the processor 1410 to access and communicate with memory 1430 that includes a volatile memory 1432 and/or a non-volatile memory 1434. In some embodiments, processor 1410 can be coupled with memory 1430 and chipset 1420. Processor 1410 may also be coupled to a wireless antenna 1478 to communicate with any device configured to transmit and/or receive wireless signals. In one embodiment, the wireless antenna antenna 1478 operates in accordance with, but is not limited to, the IEEE 1402.11 standard and its related family, Home Plug AV (HPAV), Ultra Wide Band (UWB), Bluetooth, WiMax, or any form of wireless communication protocol.

In some embodiments, volatile memory 1432 includes, but is not limited to, Synchronous Dynamic Random Access Memory (SDRAM), Dynamic Random Access Memory (DRAM), RAMBUS Dynamic Random Access Memory (RDRAM), and/or any other type of random access memory device. Non-volatile memory 1434 includes, but is not limited to, flash memory, phase change memory (PCM), read-only memory (ROM), electrically erasable programmable read-only memory (EEPROM), or any other type of non-volatile memory device.

Memory device 1430 stores information and instructions to be executed by processor 1410. In one embodiment, memory 1430 may also store temporary variables or other intermediate information while processor 1410 is executing instructions. In the illustrated embodiment, chipset 1420 connects with processor 1410 via Point-to-Point (PtP or P-P) interface 1417 and P-P interface 1422. Chipset 1420 enables processor 1410 to connect to other elements in system 1400. In some embodiments of the disclosure, P-P interface 1417 and P-P interface 1422 can operate in accordance with a PtP communication protocol, such as the Intel® QuickPath Interconnect (QPI) or the like. In other embodiments, a different interconnect may be used.

In some embodiments, chipset 1420 can be configured to communicate with processor 1410, the processor N 1405, display device 1440, and other devices 1472, 1476, 1474, 1460, 1462, 1464, 1466, 1477, etc. Chipset 1420 may also be coupled to the wireless antenna 1478 to communicate with any device configured to transmit and/or receive wireless signals.

Chipset 1420 connects to display device 1440 via interface 1426. Display 1440 may be, for example, a liquid crystal display (LCD), a plasma display, cathode ray tube (CRT) display, or any other form of visual display device. In some embodiments of the disclosure, processor 1410 and chipset 1420 are integrated into a single SOC. In addition, chipset 1420 connects to bus 1450 and/or bus 1455 that interconnect various elements 1474, 1460, 1462, 1464, and 1466. Bus 1450 and bus 1455 may be interconnected via a bus bridge 1472. In one embodiment, chipset 1420 couples with a non-volatile memory 1460, a mass storage device(s) 1462, a keyboard/mouse 1464, and a network interface 1466 via interface 1424 and/or 1404, smart TV 1476, consumer electronics 1477, etc.

In one embodiment, mass storage device(s) 1462 can include, but not be limited to, a solid state drive, a hard disk drive, a universal serial bus flash memory drive, or any other form of computer data storage medium. In one embodiment, network interface 1466 is implemented by any type of well-known network interface standard including, but not limited to, an Ethernet interface, a universal serial bus (USB) interface, a Peripheral Component Interconnect (PCI) Express interface, a wireless interface and/or any other suitable type of interface. In one embodiment, the wireless interface operates in accordance with, but is not limited to, the IEEE 802.11 standard and its related family, Home Plug AV (HPAV), Ultra Wide Band (UWB), Bluetooth, WiMax, or any form of wireless communication protocol.

While the modules shown in FIG. 7 are depicted as separate blocks within the system 1400, the functions performed by some of these blocks may be integrated within a single semiconductor circuit or may be implemented using two or more separate integrated circuits. For example, although cache memory 1416 is depicted as a separate block within processor 1410, cache memory 1416 or selected elements thereof can be incorporated into processor core 1412.

It is noted that the system 1400 described herein may be any suitable type of microelectronics packaging and configurations thereof, including, for example, system in a package (SiP), system on a package (SOP), package on package (PoP), interposer package, 3D stacked package, etc. Further, any suitable type of microelectronic components may be provided in the semiconductor packages, as described herein. For example, microcontrollers, microprocessors, baseband processors, digital signal processors, memory dies, field gate arrays, logic gate dies, passive component dies, MEMSs, surface mount devices, application specific integrated circuits, baseband processors, amplifiers, filters, combinations thereof, or the like may be packaged in the semiconductor packages, as disclosed herein. The semiconductor packages (for example, the semiconductor packages described in connection with any of FIGS. 1-6), as disclosed herein, may be provided in any variety of electronic device including consumer, industrial, military, communications, infrastructural, and/or other electronic devices.

In various embodiments, the devices, as described herein, may be used in connection with one or more processors. The one or more processors may include, without limitation, a central processing unit (CPU), a digital signal processor(s) (DSP), a reduced instruction set computer (RISC), a complex instruction set computer (CISC), a microprocessor, a microcontroller, a field programmable gate array (FPGA), or any combination thereof. The processors may also include one or more application specific integrated circuits (ASICs) or application specific standard products (ASSPs) for handling specific data processing functions or tasks. In certain embodiments, the processors may be based on an Intel® Architecture system and the one or more processors and any chipset included in an electronic device may be from a family of Intel® processors and chipsets, such as the Intel®

Atom® processor(s) family or Intel-64 processors (for example, Sandy Bridge®, Ivy Bridge®, Haswell®, Broadwell®, Skylake®, etc.).

Additionally or alternatively, the devices, as described herein, may be used in connection with one or more additional memory chips. The memory may include one or more volatile and/or non-volatile memory devices including, but not limited to, magnetic storage devices, read-only memory (ROM), random access memory (RAM), dynamic RAM (DRAM), static RAM (SRAM), synchronous dynamic RAM (SDRAM), double data rate (DDR) SDRAM (DDR-SDRAM), RAM-BUS DRAM (RDRAM), flash memory devices, electrically erasable programmable read-only memory (EEPROM), non-volatile RAM (NVRAM), universal serial bus (USB) removable memory, or combinations thereof.

In example embodiments, the electronic device in which the disclosed devices are used and/or provided may be a computing device. Such a computing device may house one or more boards on which the devices may be disposed. The board may include a number of components including, but not limited to, a processor and/or at least one communication chip. The processor may be physically and electrically connected to the board through, for example, electrical connections of the devices. The computing device may further include a plurality of communication chips. For instance, a first communication chip may be dedicated to shorter range wireless communications such as Wi-Fi and Bluetooth, and a second communication chip may be dedicated to longer range wireless communications such as GPS, EDGE, GPRS, CDMA, WiMAX, LTE, EV-DO, and others. In various example embodiments, the computing device may be a laptop, a netbook, a notebook, an ultrabook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, combinations thereof, or the like. In further example embodiments, the computing device may be any other electronic device that processes data.

Example 1 is a transistor device, comprising: a substrate; a buffer layer disposed on the substrate; a source disposed on the buffer layer; a drain disposed on the buffer layer; a channel disposed on the buffer layer; a first gate disposed on the channel between the source and the drain, wherein the first gate has a first connecting portion connecting a first side edge of the first gate proximate to the source and a lower edge proximate the channel, and a second connecting portion connecting a second side edge of the first gate proximate to the drain and the lower edge proximate the channel, and wherein at least one of the first connecting portion or the second connecting portion comprises more than one angle. In example 2, the device of example 1 can optionally include a second gate, wherein the second gate has a third connecting portion connecting a first side edge of the second gate proximate to the source and an upper edge proximate the channel, and a second connecting portion connecting a second side edge of the second gate proximate to the drain and the upper edge proximate the channel, and wherein at least one of the first connecting portion or the second connecting portion comprises more than one angle. In example 3, the device of any one of examples 1 or 2 can optionally include a channel having a first connecting portion connecting a first side edge of the channel gate proximate to the source and an upper edge of the channel, and a second connecting portion connecting a second side edge of the channel proximate to the drain and the upper edge of the channel, and wherein at least one of the first connecting portion or the second connecting portion comprises more than one angle. In example 4, the device of any one of examples 1-3 can optionally include a channel having a first connecting portion connecting a first side edge of the channel gate proximate to the source and an lower edge of the channel, and a second connecting portion connecting a second side edge of the channel proximate to the drain and the lower edge of the channel, and wherein at least one of the first connecting portion or the second connecting portion comprises more than one angle. In example 5, the device of any one of examples 1-4 can optionally include a source comprising a material having a first crystallographic face of a first orientation proximate to the first connecting portion of the gate. In example 6, the device of any one of examples 1-5 can optionally include a drain comprising a material having a second crystallographic facet of a second orientation proximate to the first connecting portion of the gate. In example 7, the device of example 5 can optionally include a first orientation of the first crystallographic face having Miller indices of (111). In example 8, the device of example 6 can optionally include a second orientation of the second crystallographic facet having Miller indices of (111). In example 9, the device of any one of examples 1-8 can optionally include a source or the drain comprising an n-doped InGaAs material. In example 10, the device of any one of examples 1-9 can optionally include a channel comprising an InGaAs material. In example 11, the device of any one of examples 1-10 can optionally include a gate material comprising a high-k dielectric material.

Example 12 is a method for fabricating a transistor device, the method comprising: providing a substrate; providing a buffer layer disposed on the substrate; providing a source disposed on the buffer layer; providing a drain disposed on the buffer layer; providing a channel disposed on the buffer layer; providing a sacrificial gate material and one or more spacers disposed on the channel; removing the sacrificial gate material and a portion of the buffer layer; removing a first portion of a first side of the channel to generate a first recess having a first connecting portion proximate to the source, and a second connecting portion proximate to the drain, wherein the first connecting portion or the second connecting portion comprises more than one angle; removing a second portion of a second side of the channel to generate a second recess having a third connecting portion proximate to the source, and a fourth connecting portion proximate to the drain, wherein the third connecting portion or the fourth connecting portion comprises more than one angle; depositing a first gate material in the first recess; depositing a second gate material in the second recess; depositing a first gate on the first gate material; depositing a second gate on the second gate material; depositing a source contact on the source; and depositing a drain contact on the drain. In example 13, the method of example 12 can optionally include removing the first portion of the first side of the channel comprising removing the first portion of the first side of the channel using an isotropic etch process. In example 14, the method of example 12 or 13 can optionally include removing the second portion of the second side of the channel comprising removing the second portion of the second side of the channel using an isotropic etch process. In example 15, the method of example 12-14 can optionally include providing the source or providing the drain comprising providing an n-doped InGaAs material. In example 16, the method of example 12-15 can optionally include providing the channel comprising providing an InGaAs material. In example 17, the method of example 12-16 can optionally include depositing the first gate material comprising depositing a high-k dielectric material.

Example 18 is a method for fabricating a transistor device, the method comprising: providing a substrate; providing a buffer layer disposed on the substrate; providing a source disposed on the buffer layer, the source having a first crystallographic facet of a first orientation; providing a drain disposed on the buffer layer, the drain having a second crystallographic facet of a second orientation; providing a channel disposed on the buffer layer; providing a sacrificial gate material disposed on the channel; providing an interlayer dielectric layer disposed on the source and the drain; removing the sacrificial gate material to produce a first recess and a portion of the buffer layer to produce a second recess; removing a portion of the interlayer dielectric layer to produce a third recess; depositing a first gate material and a first gate metal in the second recess; and depositing a second gate material and a second gate metal in the third recess. In example 19, the method of claim 18 can optionally include a first orientation of the first crystallographic facet having Miller indices of (111). In example 20, the method of any one of claim 18 or 19 can optionally include a second orientation of the second crystallographic facet having Miller indices of (111). In example 21, the method of any one of 18-20 can optionally include providing the source or providing the drain comprising providing an n-doped InGaAs material. In example 22, the method of any one of 18-21 can optionally include providing the channel comprising providing an InGaAs material. In example 23, the method of any one of 18-22 can optionally include providing the gate material comprises providing a high-k dielectric material.

Example 24 is a system comprising: a transistor device, comprising: a substrate; a buffer layer disposed on the substrate; a source disposed on the buffer layer; a drain disposed on the buffer layer; a channel disposed on the buffer layer; a first gate disposed on the channel between the source and the drain, wherein the first gate has a first connecting portion connecting a first side edge of the first gate proximate to the source and a lower edge proximate the channel, and a second connecting portion connecting a second side edge of the first gate proximate to the drain and the lower edge proximate the channel, and wherein at least one of the first connecting portion or the second connecting portion comprises more than one angle. In example 25, the system of example 24 can optionally include a second gate, wherein the second gate has a third connecting portion connecting a first side edge of the second gate proximate to the source and an upper edge proximate the channel, and a second connecting portion connecting a second side edge of the second gate proximate to the drain and the upper edge proximate the channel, and wherein at least one of the first connecting portion or the second connecting portion comprises more than one angle. In example 26, the system of any one of examples 24 or 25 can optionally include a channel having a first connecting portion connecting a first side edge of the channel gate proximate to the source and an upper edge of the channel, and a second connecting portion connecting a second side edge of the channel proximate to the drain and the upper edge of the channel, and wherein at least one of the first connecting portion or the second connecting portion comprises more than one angle. In example 27, the system of any one of examples 24-26 can optionally include a channel having a first connecting portion connecting a first side edge of the channel gate proximate to the source and an lower edge of the channel, and a second connecting portion connecting a second side edge of the channel proximate to the drain and the lower edge of the channel, and wherein at least one of the first connecting portion or the second connecting portion comprises more than one angle. In example 28, the system of any one of examples 24-27 can optionally include a source comprising a material having a first crystallographic face of a first orientation proximate to the first connecting portion of the gate. In example 29, the system of any one of examples 24-28 can optionally include a drain comprising a material having a second crystallographic facet of a second orientation proximate to the first connecting portion of the gate. In example 30, the system of example 28 can optionally include a first orientation of the first crystallographic face having Miller indices of (111). In example 31, the system of example 29 can optionally include a second orientation of the second crystallographic facet having Miller indices of (111). In example 32, the system of any one of examples 24-31 can optionally include a source or the drain comprising an n-doped InGaAs material. In example 33, the system of any one of examples 24-32 can optionally include a channel comprising an InGaAs material. In example 34, the system of any one of examples 24-33 can optionally include a gate material comprising a high-k dielectric material.

Various features, aspects, and embodiments have been described herein. The features, aspects, and embodiments are susceptible to combination with one another as well as to variation and modification, as will be understood by those having skill in the art. The present disclosure should, therefore, be considered to encompass such combinations, variations, and modifications.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Other modifications, variations, and alternatives are also possible. Accordingly, the claims are intended to cover all such equivalents.

While the disclosure includes various embodiments, including at least a best mode, it is to be understood that many alternatives, modifications, and variations will be apparent to those skilled in the art in light of the foregoing description. Accordingly, the disclosure is intended to embrace all such alternatives, modifications, and variations, which fall within the scope of the included claims. All matters disclosed herein or shown in the accompanying drawings are to be interpreted in an illustrative and non-limiting sense.

This written description uses examples to disclose certain embodiments of the disclosure, including the best mode, and also to enable any person skilled in the art to practice certain embodiments of the disclosure, including making and using any apparatus, devices or systems and performing any incorporated methods and processes. The patentable scope of certain embodiments of the disclosure is defined in the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. A transistor device, comprising:
a substrate;
a buffer layer on the substrate;
a source on the buffer layer;
a drain on the buffer layer;
a channel on the buffer layer;
a gate on the channel between the source and the drain, wherein the gate includes,
   a first connecting portion connecting a first side edge of the gate proximate to the source and a lower edge proximate the channel, and
   a second connecting portion connecting a second side edge of the gate proximate to the drain and the lower edge proximate the channel,
   wherein at least one of the first connecting portion or the second connecting portion comprises more than one angle.

2. The device of claim 1, wherein the gate is a first gate, the device further comprising a second gate, wherein the second gate includes,
a third connecting portion connecting a first side edge of the second gate proximate to the source and an upper edge proximate the channel, and
a fourth connecting portion connecting a second side edge of the second gate proximate to the drain and the upper edge proximate the channel,
wherein at least one of the third connecting portion or the fourth connecting portion comprises more than one angle.

3. The device of claim 2 wherein the channel includes,
a seventh connecting portion connecting a first side edge of the channel gate proximate to the source and a lower edge of the channel, and
an eighth connecting portion connecting a second side edge of the channel proximate to the drain and the lower edge of the channel,
wherein at least one of the seventh connecting portion or the eighth connecting portion comprises more than one angle.

4. The device of claim 1, wherein the channel includes,
a fifth connecting portion connecting a first side edge of the channel gate proximate to the source and an upper edge of the channel, and
a sixth connecting portion connecting a second side edge of the channel proximate to the drain and the upper edge of the channel,
wherein at least one of the fifth connecting portion or the sixth connecting portion comprises more than one angle.

5. The device of claim 1, wherein the source comprises a material having a first crystallographic face of a first orientation proximate to the first connecting portion of the gate.

6. The device of claim 5, wherein the first orientation of the first crystallographic facet has Miller indices of (111).

7. The device of claim 1, wherein the drain comprises a material having a second crystallographic facet of a second orientation proximate to the first connecting portion of the gate.

8. The device of claim 7, wherein the second orientation of the second crystallographic facet has Miller indices of (111).

9. The device of claim 1, wherein the source or the drain comprises an n-doped InGaAs material.

10. The device of claim 1, wherein the channel comprises an InGaAs material.

11. The device of claim 1, wherein the gate material comprises a high-k dielectric material.

12. A method for fabricating a transistor device, the method comprising:
providing a substrate;
providing a buffer layer disposed on the substrate;
providing a source disposed on the buffer layer;
providing a drain disposed on the buffer layer;
providing a channel disposed on the buffer layer;
providing a sacrificial gate material and one or more spacers disposed on the channel;
removing the sacrificial gate material and a portion of the buffer layer;
removing a first portion of a first side of the channel to form a first recess having a first connecting portion proximate to the source and a second connecting portion proximate to the drain, wherein the first connecting portion or the second connecting portion comprises more than one angle;
removing a second portion of a second side of the channel to form a second recess having a third connecting portion proximate to the source, and a fourth connecting portion proximate to the drain, wherein the third connecting portion or the fourth connecting portion comprises more than one angle;
depositing a first gate material in the first recess;
depositing a second gate material in the second recess;
depositing a first gate on the first gate material;
depositing a second gate on the second gate material;
depositing a source contact on the source; and
depositing a drain contact on the drain.

13. The method of claim 12, wherein removing the first portion of the first side of the channel comprises removing the first portion of the first side of the channel using an isotropic etch process.

14. The method of claim 12, wherein removing the second portion of the second side of the channel comprising removing the second portion of the second side of the channel using an isotropic etch process.

15. The method of claim 12, wherein providing the source or providing the drain comprises providing an n-doped InGaAs material.

16. The method of claim 12, wherein providing the channel comprises providing an InGaAs material.

17. The method of claim 12, wherein depositing the first gate material comprises depositing a high-k dielectric material.

18. A method for fabricating a transistor device, the method comprising:
providing a substrate;
providing a buffer layer disposed on the substrate;
providing a source disposed on the buffer layer, the source having a first crystallographic facet of a first orientation;
providing a drain disposed on the buffer layer, the drain having a second crystallographic facet of a second orientation;
providing a channel disposed on the buffer layer;
providing a sacrificial gate material disposed on the channel;
providing an interlayer dielectric layer disposed on the source and the drain;
removing the sacrificial gate material to form a first recess and a portion of the buffer layer to form a second recess;
removing a portion of the interlayer dielectric layer to form a third recess;

depositing a first gate metal in the second recess; and
depositing a second gate material and a second gate metal in the third recess.

19. The method of claim 18, wherein the first orientation of the first crystallographic facet has Miller indices of (111).

20. The method of claim 18, wherein second orientation of the second crystallographic facet has Miller indices of (111).

* * * * *